US008062938B2

(12) United States Patent
Nishiyama et al.

(10) Patent No.: US 8,062,938 B2
(45) Date of Patent: Nov. 22, 2011

(54) SEMICONDUCTOR DEVICE AND METHOD OF FABRICATING THE SAME

(75) Inventors: Nobuyasu Nishiyama, Kanagawa (JP); Katsunori Yahashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 12/656,767

(22) Filed: Feb. 16, 2010

(65) Prior Publication Data

US 2010/0151645 A1 Jun. 17, 2010

Related U.S. Application Data

(62) Division of application No. 11/790,517, filed on Apr. 26, 2007, now Pat. No. 7,683,436.

(30) Foreign Application Priority Data

Apr. 28, 2006 (JP) .................................. 2006-126965

(51) Int. Cl.
*H01L 21/00* (2006.01)
(52) U.S. Cl. ......... 438/157; 438/151; 438/284; 438/595
(58) Field of Classification Search .................. 438/151, 438/157, 164, 176, 283, 284, 595
See application file for complete search history.

(56) References Cited

U.S. PATENT DOCUMENTS

| 6,525,403 B2 | 2/2003 | Inaba et al. |
| 6,821,834 B2 | 11/2004 | Ando |
| 6,888,181 B1 | 5/2005 | Liao et al. |
| 6,897,527 B2 | 5/2005 | Dakshina-Murthy et al. |
| 6,998,676 B2 | 2/2006 | Kondo et al. |
| 7,015,078 B1 | 3/2006 | Xiang et al. |
| 7,045,401 B2 | 5/2006 | Lee et al. |
| 7,190,050 B2 | 3/2007 | King et al. |

(Continued)

FOREIGN PATENT DOCUMENTS

JP 2005-268782 9/2005

OTHER PUBLICATIONS

Notification of Reasons for Rejection issued by the Japanese Patent Office on Sep. 28, 2010, for Japanese Patent Application No. 2006-126965, and English-language translation thereof.

(Continued)

*Primary Examiner* — Kevin M Picardat
(74) *Attorney, Agent, or Firm* — Finnegan, Henderson, Farabow, Garrett & Dunner, L.L.P.

(57) ABSTRACT

A semiconductor device according to an embodiment of the present invention includes: a square pole-shaped channel portion made from a first semiconductor layer formed on a substrate, and surrounded with four side faces; a gate electrode formed on a first side face of the channel portion, and a second side face of the channel portion opposite to the first side face through respective gate insulating films; a source region having a conductivity type different from that of the channel portion and being formed on a third side face of the channel portion, the source region including a second semiconductor layer having a lattice constant different from that of the first semiconductor layer and being formed directly on the substrate; and a drain region having a conductivity type different from that of the channel portion and being formed on a fourth side face of the channel portion opposite to the third side face, the drain region including the second semiconductor layer being formed directly on the substrate.

7 Claims, 34 Drawing Sheets

U.S. PATENT DOCUMENTS

| | | | |
|---|---|---|---|
| 7,271,456 B2 | 9/2007 | Oh et al. | |
| 7,323,389 B2 | 1/2008 | Goktepeli et al. | |
| 7,335,545 B2 | 2/2008 | Currie | |
| 7,355,253 B2 | 4/2008 | Cohen | |
| 7,384,838 B2 | 6/2008 | Hsu et al. | |
| 7,439,594 B2 | 10/2008 | Mouli | |
| 7,528,465 B2 | 5/2009 | King et al. | |
| 7,537,985 B2 * | 5/2009 | Anderson et al. | 438/176 |
| 7,550,333 B2 * | 6/2009 | Shah et al. | 438/157 |
| 7,579,280 B2 * | 8/2009 | Brask et al. | 438/696 |
| 7,772,048 B2 * | 8/2010 | Jones et al. | 438/142 |
| 2003/0178677 A1 | 9/2003 | Clark et al. | |
| 2004/0099885 A1 | 5/2004 | Yeo et al. | |
| 2004/0099903 A1 | 5/2004 | Yeo et al. | |
| 2004/0142524 A1 | 7/2004 | Grupp et al. | |
| 2006/0009001 A1 | 1/2006 | Huang et al. | |
| 2006/0054969 A1 | 3/2006 | Jang et al. | |
| 2006/0157687 A1 | 7/2006 | Doyle et al. | |
| 2006/0163643 A1 | 7/2006 | Ufert | |
| 2006/0202266 A1 | 9/2006 | Radosavljevic et al. | |
| 2007/0052041 A1 | 3/2007 | Sorada et al. | |
| 2007/0075342 A1 | 4/2007 | Kanemura | |
| 2007/0132053 A1 | 6/2007 | King et al. | |
| 2007/0187682 A1 | 8/2007 | Takeuchi et al. | |
| 2008/0142841 A1 | 6/2008 | Lindert et al. | |

OTHER PUBLICATIONS

Verheyen et al., "25% Drive Current Improvement for p-type Multiple Gate FET (MuGFET) Devices by the Introduction of Recessed $Si_{0.8}Ge_{0.2}$ in the Source and Drain Regions," 2005 Symposium on VLSI Technology Digest of Technical Papers, pp. 194-195 (2005).

* cited by examiner

SEMICONDUCTOR DEVICE AND METHOD OF FABRICATING THE SAME

CROSS-REFERENCE TO RELATED APPLICATIONS

This is a division of application Ser. No. 11/790,517, filed Apr. 26, 2007, now U.S. Pat. No. 7,683,436 which is incorporated herein by reference.

This application is based upon and claims the benefit of priority from prior Japanese Patent Application No. 2006-126965, filed on Apr. 28, 2006, the entire contents of which are incorporated herein by reference.

BACKGROUND OF THE INVENTION

The present invention relates to a semiconductor device having a fin-shaped channel portion, and a method of fabricating the same.

Shrink is required for insulated gate field-effect transistors in order to prevent a chip size from increasing along with high integration of semiconductor devices.

Cut-off characteristics of a drain current becomes worse because the drain current becomes unable to be controlled any more by a gate voltage due to a short channel effect as a gate length is shortened to make a source region and a drain region close to each other.

Therefore, even when a gate is closed, a leakage current is caused to flow between the source region and the drain region because silicon is a semiconductor having a relatively high electric conductivity. That is to say, a phenomenon called punch-through occurs. A double-gate structured field effect transistor in which not only an upper surface of a channel portion, but also a lower surface thereof is held between opposite portions of a gate electrode, thereby making it possible to perfectly control a channel by a gate voltage applied to the gate electrode is effective in suppression of the punch-through.

It is difficult to form a gate electrode on a lower surface of a channel portion in accordance with a conventional method of putting materials one on top of another, thereby fabricating an insulating gate field-effect transistor. In order to solve this problem, there is known a double-gate structured field effect transistor structured such that a channel portion is stood vertically to a surface of a substrate, and both sides of a fin-shaped channel portion is held between opposite portions of a gate electrode (hereinafter referred to as "a FINFET"). The FINFET, for example, is disclosed in a non-patent literary document of 2005 Symposium on VLSI Technology Digest of Technical Papers 11A-1, pp. 194 and 195.

For fabrication of the semiconductor device disclosed in the non-patent literary document, a silicon layer is recess-etched in order to form a source region and a drain region of a FINFET, thereby leaving a part of the silicon layer, and a silicon germanium layer is epitaxially grown on the part of the silicon layer thus left. A compressive stress is generated in a channel portion by the silicon germanium layer to give the channel portion a strain, thereby increasing a mobility of carriers.

However, the semiconductor device disclosed in the non-patent literary document involves such a problem that a dispersion necessarily occurs in a thickness of the remaining silicon layer because there is no etching stopper in the phase of the recess etching.

As a result, there is encountered such a problem that a total amount of silicon germanium layer disperses in correspondence to the thickness of the remaining silicon layer, so that the magnitude of the compressive stress generated in the channel portion fluctuates, and thus the mobility of the carriers in the channel portion necessarily disperses.

Moreover, there is caused such a problem that the lower portion of the channel portion contacts no silicon germanium layer because the remaining silicon layer underlies each of the source region and the drain region, which results in that an amount of strain in the lower portion of the channel portion decreases, thereby reducing the mobility of the carriers in the lower portion of the channel portion.

BRIEF SUMMARY OF THE INVENTION

A semiconductor device according to one embodiment of the present invention includes:

a square pole-shaped channel portion made from a first semiconductor layer formed on a substrate, and surrounded with four side faces;

a gate electrode formed on a first side face of the channel portion, and a second side face of the channel portion opposite to the first side face through respective gate insulating films;

a source region having a conductivity type different from that of the channel portion and being formed on a third side face of the channel portion, the source region including a second semiconductor layer having a lattice constant different from that of the first semiconductor layer and being formed directly on the substrate; and a drain region having a conductivity type different from that of the channel portion and being formed on a fourth side face of the channel portion opposite to the third side face, the drain region including the second semiconductor layer being formed directly on the substrate.

A method of fabricating a semiconductor device according to another embodiment of the present invention includes:

processing a semiconductor layer laminated on a substrate, thereby forming a fin-shaped first semiconductor layer;

forming a gate electrode on parts of both side faces of the first semiconductor layer through respective gate insulating films;

forming sidewall films on regions, each having no gate electrode formed thereon, of the both side faces of the first semiconductor layer;

removing the first semiconductor layer until a surface of the substrate is exposed while a part of the first semiconductor layer is left between the sidewall films; and growing a second semiconductor layer from a surface of the part of the first semiconductor layer thus left to fill a gap defined between the sidewall films with the second semiconductor layer, thereby forming a source region and a drain region each having a conductivity type different from that of the first semiconductor layer.

DETAILED DESCRIPTION OF THE INVENTION

First to third embodiments of the present invention will be described in detail hereinafter with reference to the accompanying drawings.

Figure 1:
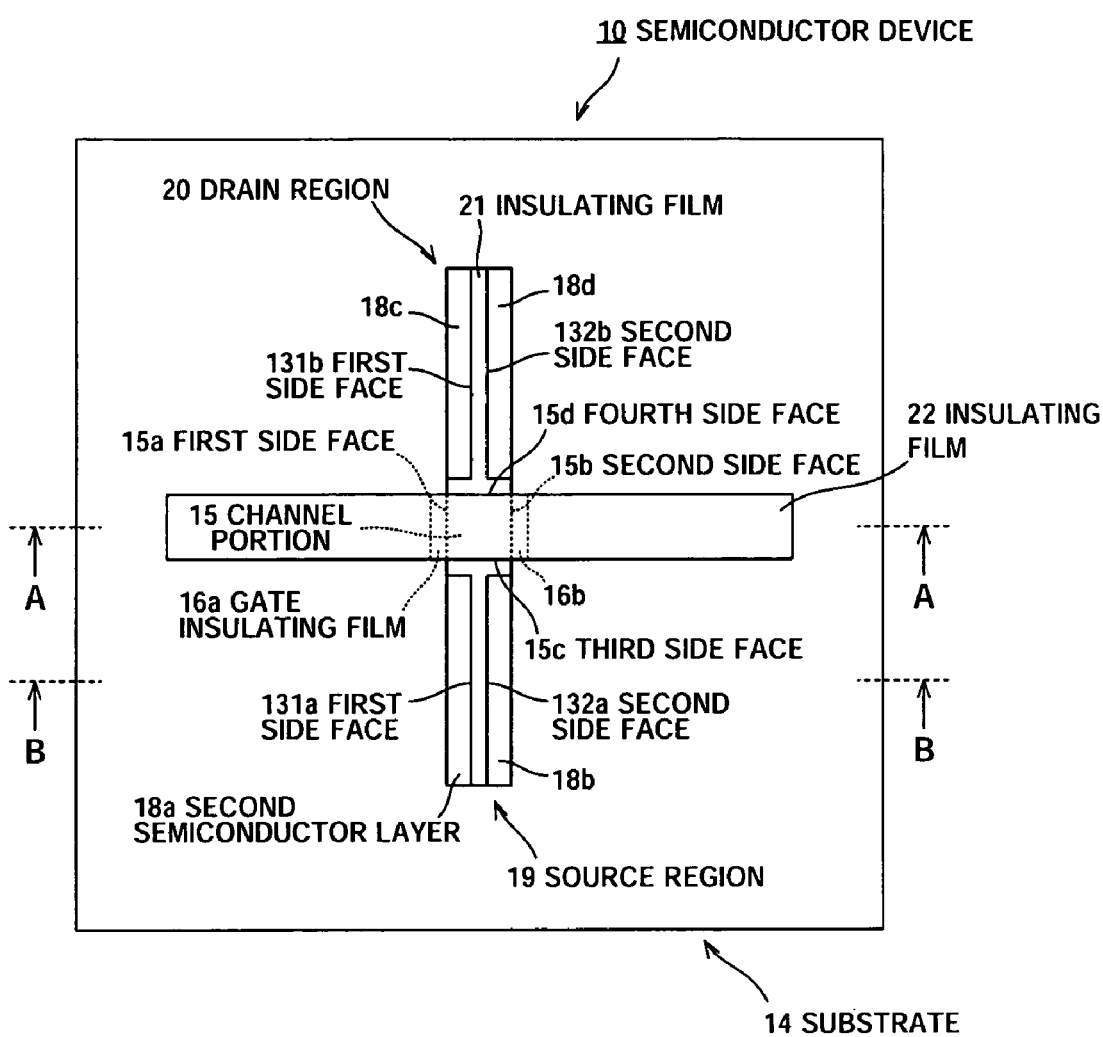
FIG. 1 is a plan view of a semiconductor device according to a first embodiment of the present invention.
Figure 2A:
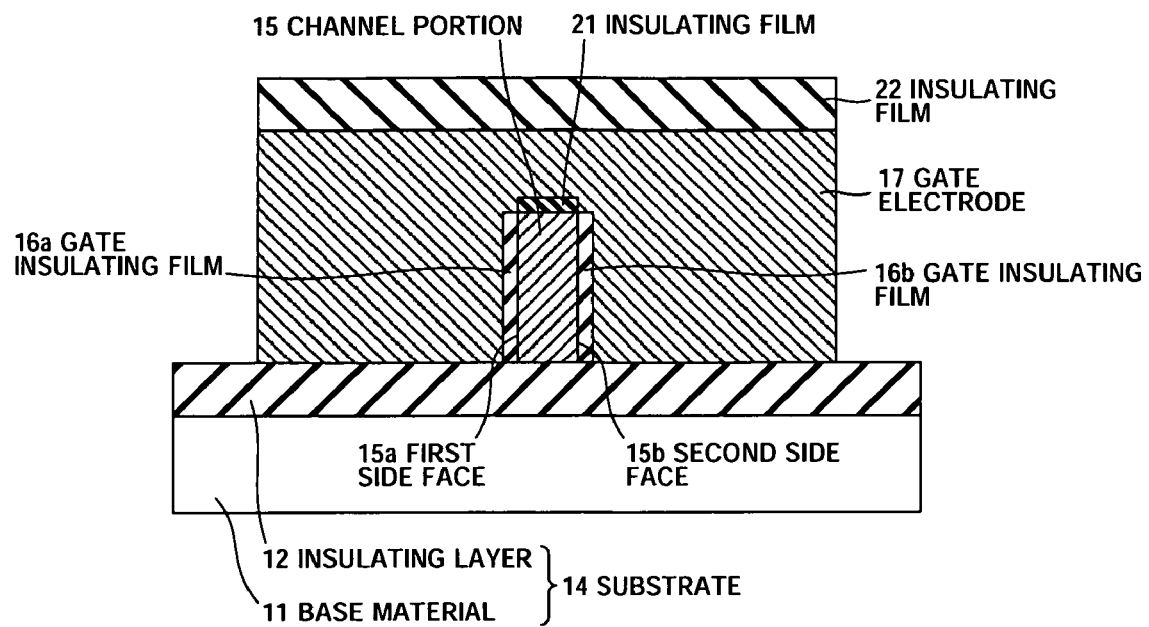
FIG. 2A is a cross sectional view taken on line A-A of FIG. 1.
Figure 2B:
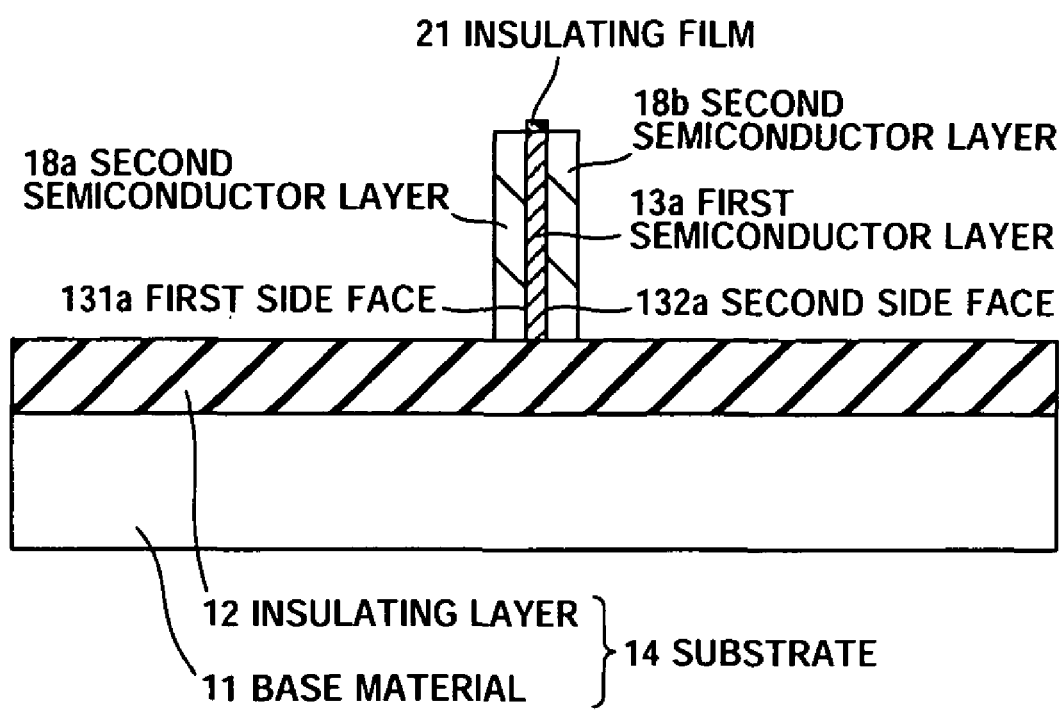
FIG. 2B is a cross sectional view taken on line B-B of FIG. 1.
Figure 3A:
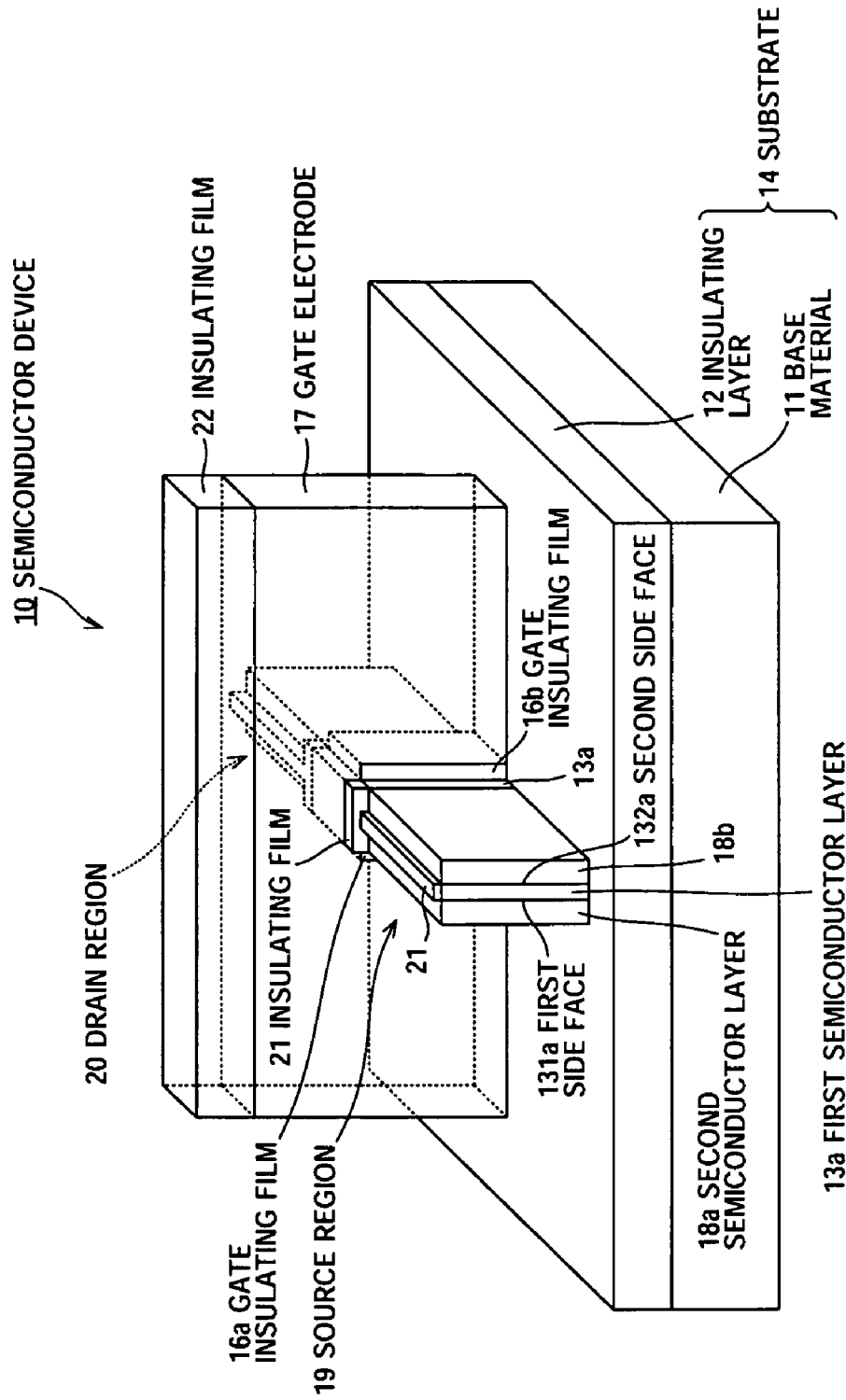
FIGS. 3A and 3B are respectively perspective views of the semiconductor device according to the first embodiment of the present invention.
Figure 3B:
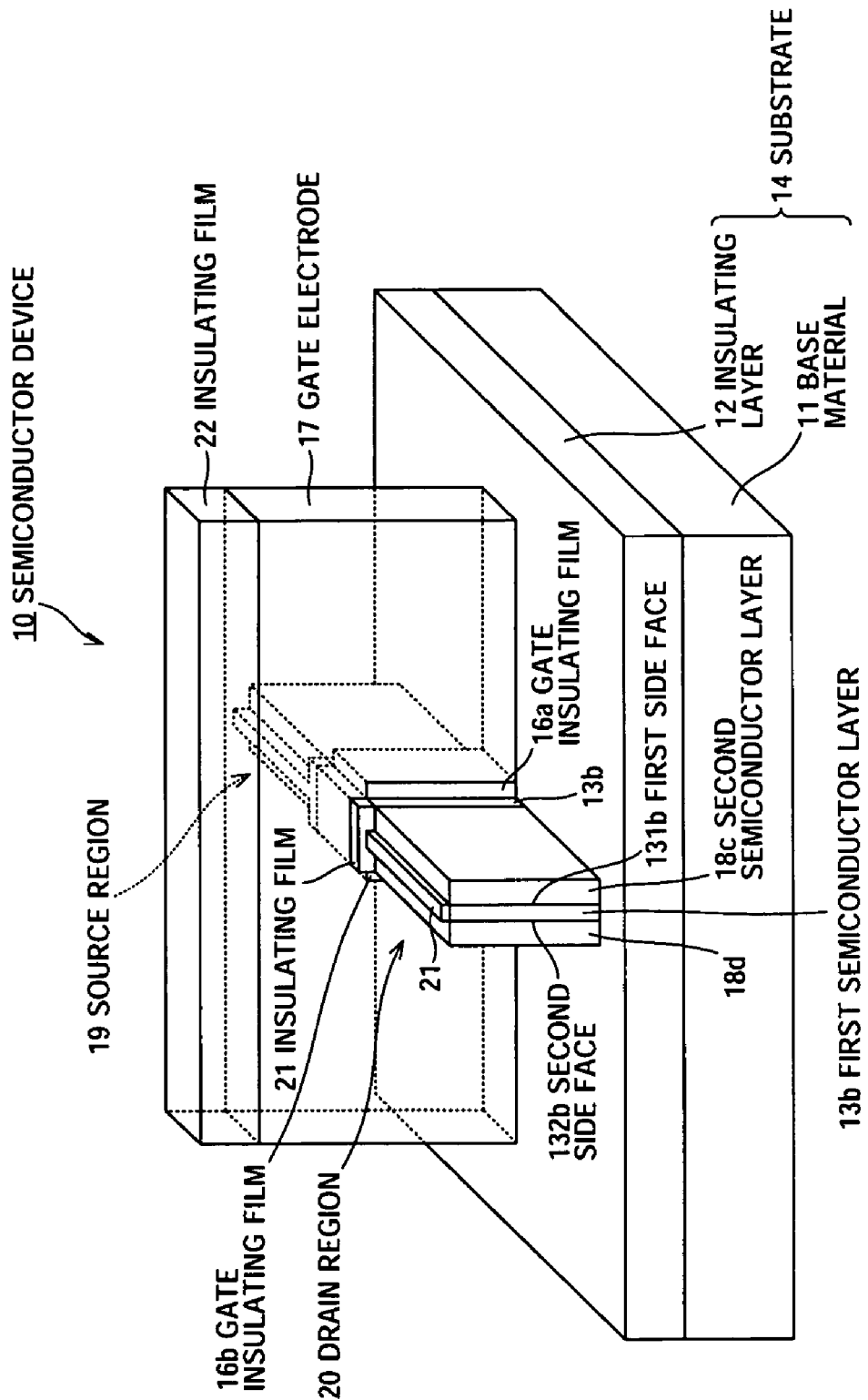

Firstly, the first embodiment of the present invention will now be described in detail with reference FIGS. 1 to 17. FIG. 1 is a plan view of a semiconductor device according to the first embodiment of the present invention, FIG. 2A is across sectional view taken on line A-A of FIG. 1, FIG. 2B is a cross sectional view taken on line B-B of FIG. 1, and FIGS. 3A and 3B are respectively perspective views of the semiconductor device according to the first embodiment of the present invention.

As shown in FIG. 1, FIGS. 2A and 2B, and FIGS. 3A and 3B, a semiconductor device 10 of this embodiment is a p-channel FINFET including a substrate 14 having a base material 11 and an insulating layer 12 formed on the base material 11, a square pole-shaped channel portion 15 which is formed by processing a first semiconductor layer 13 laminated on the insulating layer 12 of the substrate 14 and which is surrounded with first to fourth side faces 15a, 15b, 15c and 15d which are formed so as to be approximately vertical to a surface of the substrate 14, and a gate electrode 17 which is formed on the first side face 15a of the channel portion 15 and the second side face 15b of the channel portion 15 opposite to the first side face 15a through respective gate insulating films 16a and 16b so as to straddle the channel portion 15.

Moreover, the semiconductor device 10 of this embodiment includes a source region 19 which is formed on the third side face 15c of the channel portion 15, and which has second semiconductor layers 18a and 18b which are formed directly on the insulating layer 12 of the substrate 14 and each of which has a conductivity type different from that of the first semiconductor layer 13, and a drain region 20 which is formed on a fourth side face 15d of the channel portion 15 opposite to the third side face 15c, and which has second semiconductor layers 18c and 18d which are formed directly on the insulating layer 12 of the substrate 14 and each of which has the conductivity type different from that of the first semiconductor layer 13.

In addition, the second semiconductor layers 18a and 18b of the source region 19 are formed along the first and second side faces 131a and 132a of the first semiconductor layer 13a, respectively.

Likewise, the second semiconductor layers 18c and 18d of the drain region 20 are formed along the first and second side faces 131b and 132b of the first semiconductor layer 13b, respectively.

An insulating film 21 is formed on the channel portion 15, and each of the first semiconductor layers 13a and 13b, and an insulating film 22 is formed on the gate electrode 17.

In addition, a sidewall film (not shown) is formed on each of side faces of the second semiconductor layers 18a, 18b, and 18c, 18d, and the gate electrode 17. A height of a vertex in cross section of the sidewall film formed on each of the side faces of the second semiconductor layers 18a, 18b, and 18c, 18d is higher than a position of an upper surface of the insulating film 21 formed on each of the first semiconductor layers 13a and 13b.

The substrate 14, and the first semiconductor layer 13 laminated on the substrate 14 have a separation by implantation of oxygen (SIMOX) structure in which for example, oxygen ions are implanted into a deep position through a surface of a silicon substrate, and a heat treatment is then performed at a high temperature, so that a silicon layer is laminated on the silicon substrate through a silicon oxide film.

Each of the second semiconductor layers 18a, 18b, and 18c, 18d is made of a material having a lattice constant larger than that of the first semiconductor layer 13. For example, an n-type silicon (Si) crystal can be used as a material for the first semiconductor layer 13, and a p-type silicon germanium (hereinafter referred to as "SiGe") crystal having a Ge concentration of about 10 to about 30 at % can be used as a material for each of the second semiconductor layers 18a, 18b, and 18c, 18d.

A pattern of the channel region 15, the source region 19 and the drain region 20 is formed by digging down the first semiconductor layer 13 on the insulating layer 12 from its surface until the surface of the insulating layer 12 is exposed. Hence, the heights of the channel region 15, the source region 19 and the drain region 20 are approximately equal to one another, and for example, are set in the range of about 100 to about 200 nm which approximately corresponds to a thickness of the first semiconductor layer 13.

A length (gate length) of the channel portion 15, for example, is in the range of about 20 to about 30 nm, and a width (gate width) thereof, for example, is in the range of about 20 to about 30 nm.

A length of each of the source region 19 and the drain region 20, for example, is about 100 nm, and a pad region (not shown) for electrical connection to the outside is formed on a side of each of the source region 19 and the drain region 20 opposite to the gate electrode 17.

The second semiconductor layers 18a and 18b of the source region 19, and the second semiconductor layers 18c and 18d of the drain region 20 are strained because the lattice constant of each of them is larger than that of silicon. Thus, a tensile stress is generated as an internal stress in each of the second semiconductor layers 18a, 18b, and 18c, 18d, and the second semiconductor layers 18a, 18b, and 18c, 18d exerts a compressive stress on the channel portion 15.

Reception of the compressive stress in the channel portion 15 results in a mobility of carriers, that is, holes in this embodiment being increased.

Figure 4:
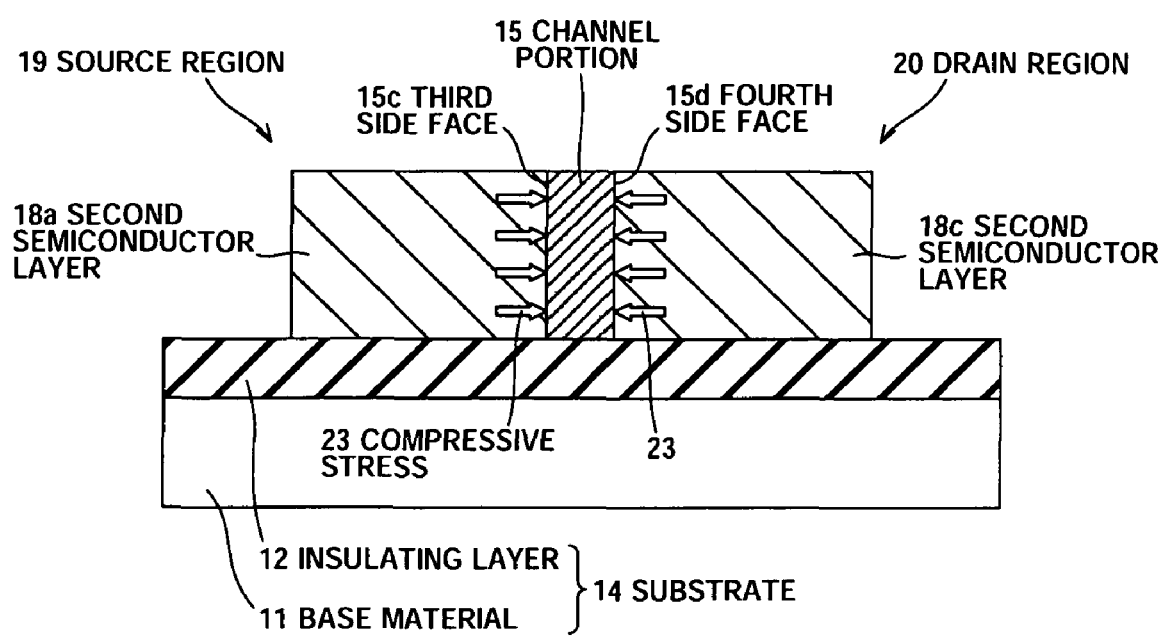
FIG. 4 is a conceptual view showing effects of the semiconductor device according to the first embodiment of the present invention.
Figure 5:
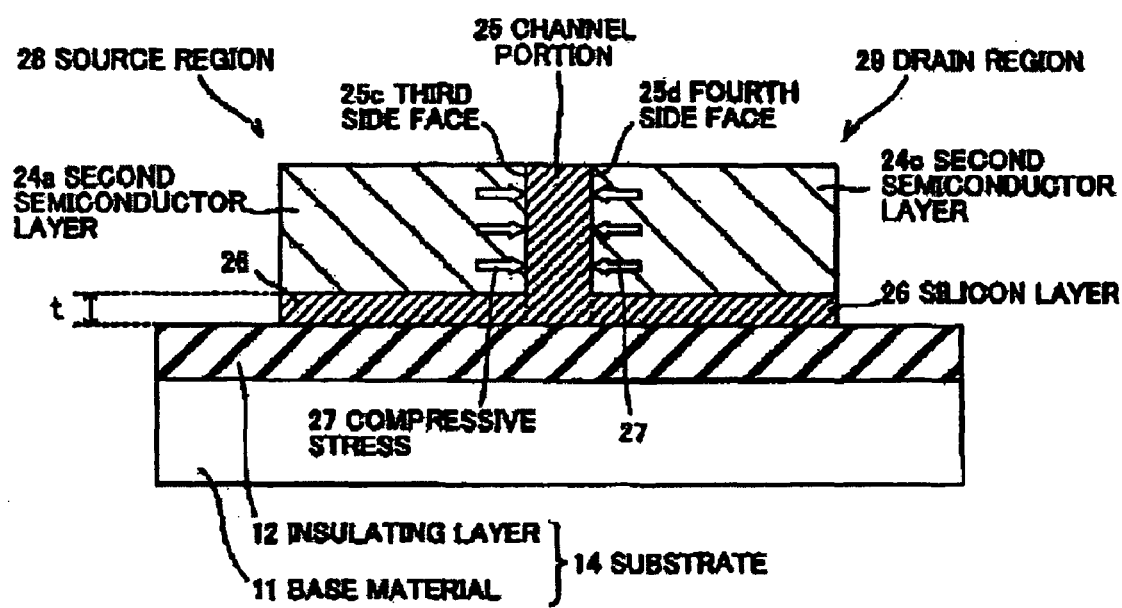
FIG. 5 is a conceptual view showing effects of a conventional semiconductor device.

FIG. 4 is a conceptual view showing effects inherent in the semiconductor device of this embodiment, and FIG. 5 is a conceptual view showing effects inherent in a conventional semiconductor device. Here, the conventional semiconductor device shown in FIG. 5 has a structure in which a silicon layer 26 is interposed between each of the second semiconductor layers 24a and 24c each being made of p-type SiGe having a Ge concentration of about 10 to about 30 at %, and an insulating layer 12 in all vertical cross sections of a source region 28 and a drain region 29.

As shown in FIG. 4, in the semiconductor device 10 of this embodiment, each of the second semiconductor layers 18a and 18b of the source region 19 is formed directly on the insulating layer 12 of the substrate 14 in a state of contacting the third side face 15c of the channel portion 15.

Likewise, each of the second semiconductor layers 18c and 18d of the drain region 20 is formed directly on the insulating layer 12 of the substrate 14 in a state of contacting the fourth side face 15d of the channel portion 15.

As a result, the second semiconductor layers 18a, 18b, and 18c, 18d which are formed over a height range from the bases to the upsides of the first and second side faces 15a and 15b of the channel portion 15 can exert approximately and uniformly a compressive stress 23 on the channel portion 15 from its lower end portion to its upper end portion.

On the other hand, as shown in FIG. 5, in the conventional semiconductor device, a second semiconductor layer 24a is formed on the substrate 14 through the silicon layer 26 which is left after completion of the recess etching. Likewise, the second semiconductor layer 24c is formed on the substrate 14 through the silicon layer 26 which is left after completion of the recess etching.

As a result, a magnitude of a compressive stress 27 which the second semiconductor layers 24a and 24c exert on the channel portion 25 fluctuates due to a dispersion of a thickness, t, of the silicon layer 26.

Moreover, no compressive stress 27 is exerted on a lower portion of the channel portion 25 because the second semiconductor layers 24a and 24c each of which is formed so as to be separated apart from the base of the side face of the channel portion 25 contact no lower portion of the channel portion 25.

As has been described above, the semiconductor device of this embodiment hardly involves such a problem that a length of contact between each of the second semiconductor layers as the stain generating source and the channel portion changes due to the dispersion of the thickness of each of the second semiconductor layers, so that the magnitude of the compressive stress exerted on the channel portion fluctuates and thus the mobility of the carriers in the channel portion disperses.

As a result, it is possible to obtain the semiconductor device 10 including the channel portion 15 having the sufficient mobility.

Note that, a total amount of second semiconductor layers 18a, 18b, and 18c, 18d increases and thus the compressive stress exerted on the channel portion 15 becomes large as a width of each of the second semiconductor layers 18a, 18b, and 18c, 18d is larger. Hence, a width of each of the first semiconductor layers 13a and 13b is more preferably thin as far as no problem is caused in terms of the fabrication.

Next, a method of fabricating the semiconductor device 10 of this embodiment will now be described in detail with reference to FIGS. 6 to 17. Here, each of cross sections shown in FIGS. 6 to 11, respectively, corresponds to that shown in FIG. 2A. In addition, each of cross sections shown in FIG. 14A, FIG. 15A and FIG. 16A, respectively, corresponds to that shown in FIG. 2B.

Figure 6:
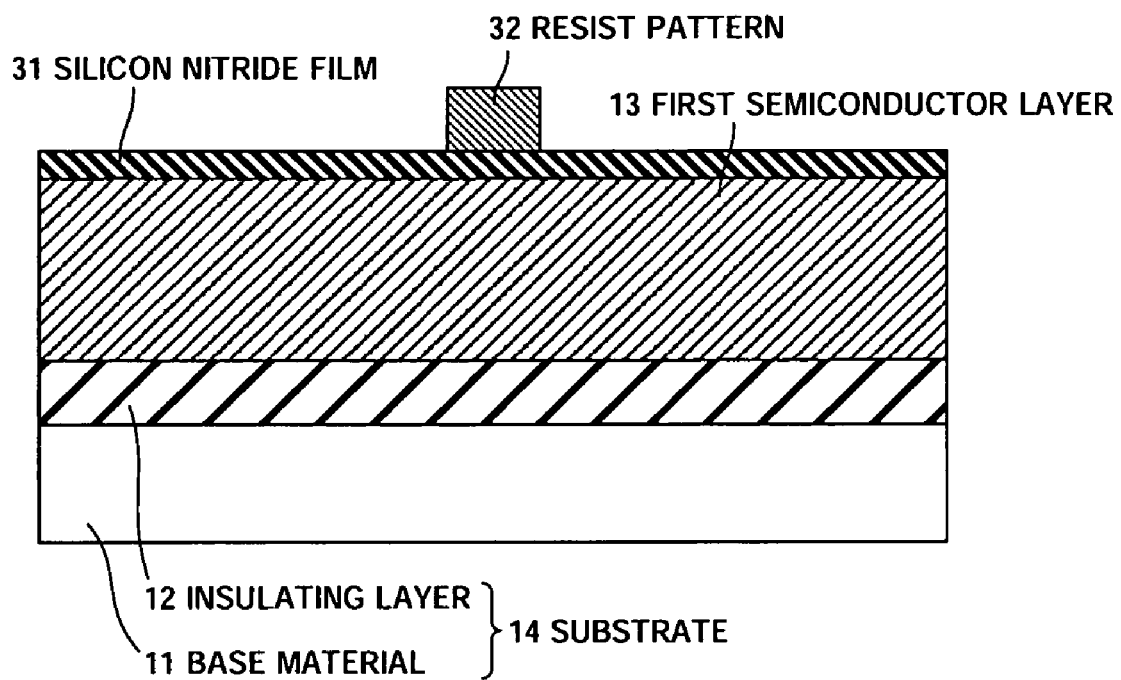
FIGS. 6 to 11 are respectively cross sectional views showing processes for fabricating the semiconductor device according to the first embodiment of the present invention in respective steps in a fabrication method.

Firstly, the SIMOX substrate is prepared, and as shown in FIG. 6, an insulating film, for example, a silicon nitride film 31 is formed on the first semiconductor layer 13 which, for example, is made of Si and laminated on the substrate 14 by, for example, utilizing a plasma chemical vapor deposition (CVD) method. After that, a resist pattern 32 which is used to pattern the first semiconductor layer 13 into a fin shape is formed on the silicon nitride film 31 by utilizing a photolithography method.

Figure 7:
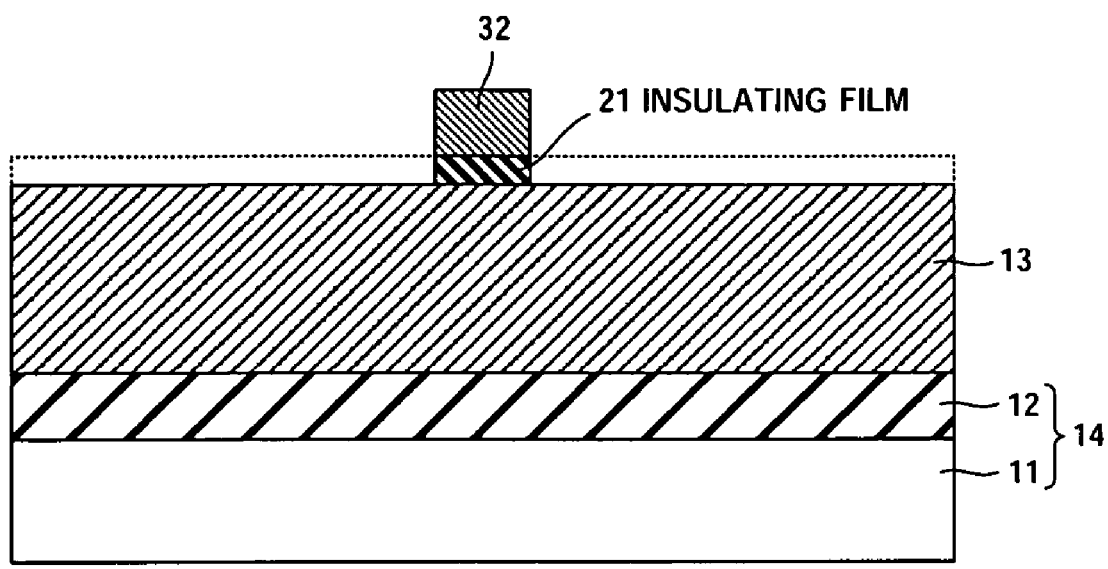

Next, as shown in FIG. 7, the silicon nitride film 31 is selectively etched away using the resist pattern 32 as a mask by, for example, utilizing a reactive ion etching (RIE) method, thereby forming an insulating film 21 to which the resist pattern 32 is transcribed.

Figure 8:
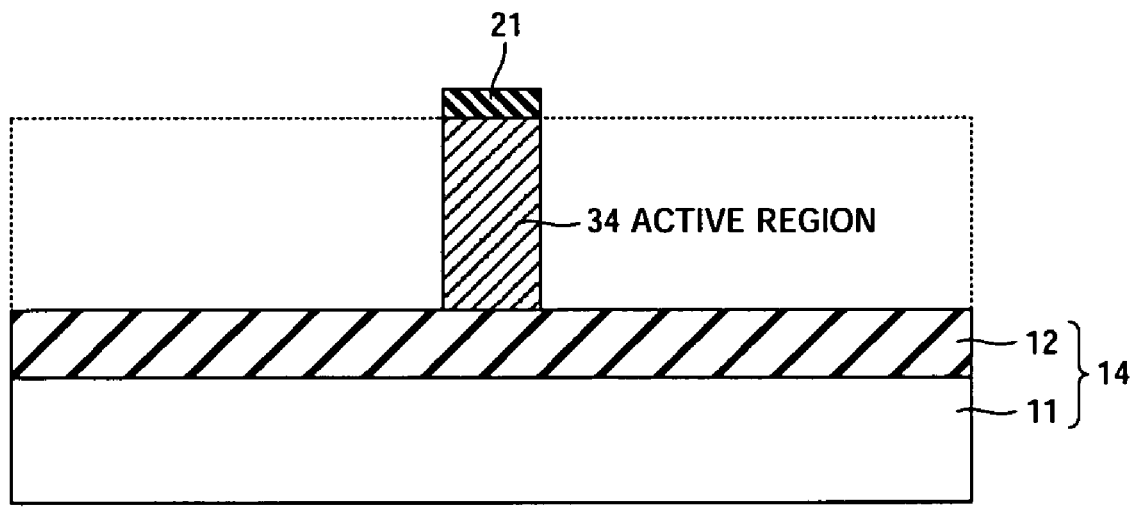

Next, as shown in FIG. 8, after the resist pattern 32 is removed, the first semiconductor layer 13 is selectively etched away until the surface of the insulating layer 12 is exposed using the insulating film 21 as a mask by, for example, utilizing the RIE method, thereby forming a fin-shaped active region 34.

Here, a central portion (a portion having an upper surface, and side faces on which the gate electrode 17 is intended to be formed through the insulating film 21, and the gate insulating films 16a and 16b, respectively) of the active region 34 is a region which is intended to become the channel portion 15 of the p-channel FINFET, and both sides of the active region 34 are regions which are intended to become the source region 19 and the drain region 20, respectively.

Figure 9:
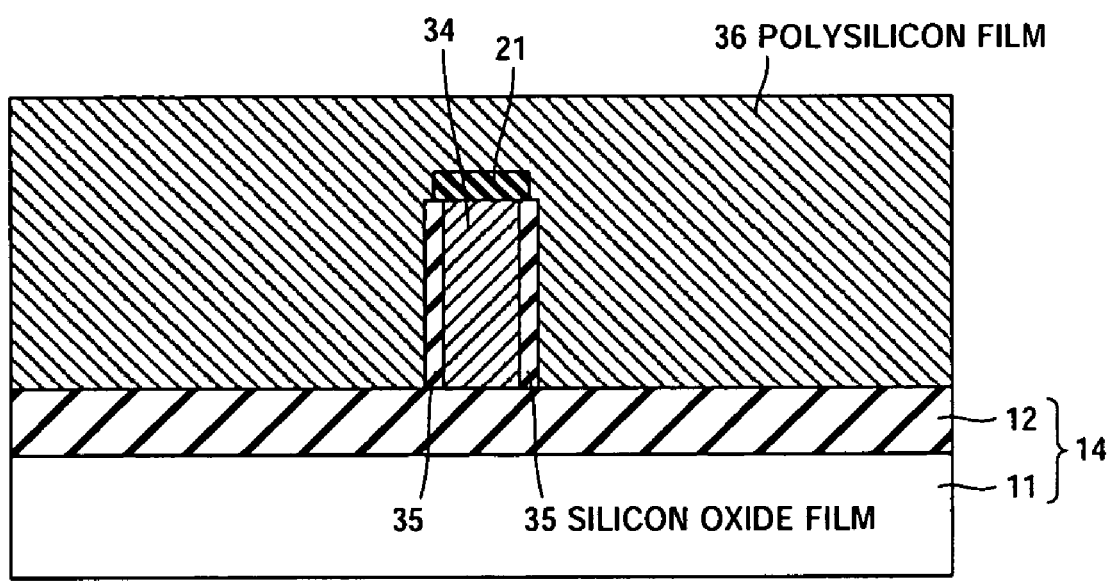

Next, as shown in FIG. 9, a silicon oxide film 35 having a thickness of about 2 nm is formed on each of the both sides of the active region 34 by, for example, performing thermal oxidation. After that, a polysilicon film 36 having a thickness of about 100 to about 500 nm is formed over the substrate 14 including the active region 34 by, for example, utilizing the CVD method.

Figure 10:
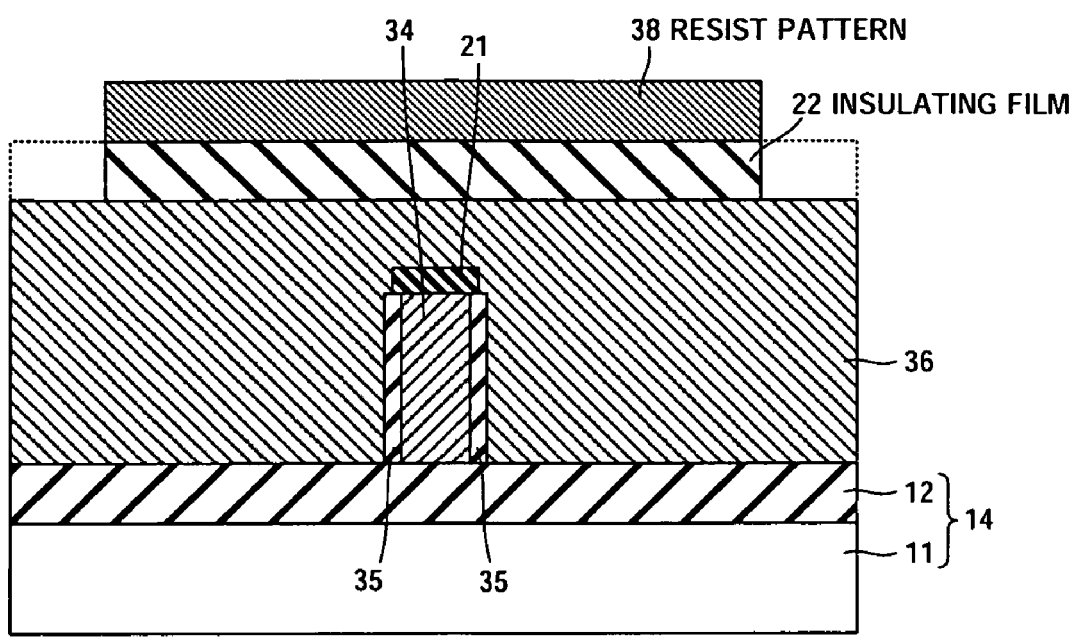

Next, as shown in FIG. 10, an insulating film 22 which, for example, is made of tetraethyl ortho silicate (TEOS) is formed on the polysilicon film 36, a resist pattern 38 is formed on the insulating film 22 by utilizing the photolithography method, and the pattern concerned is transcribed to the insulating film 22 using the resist pattern 38 as a mask.

Figure 11:
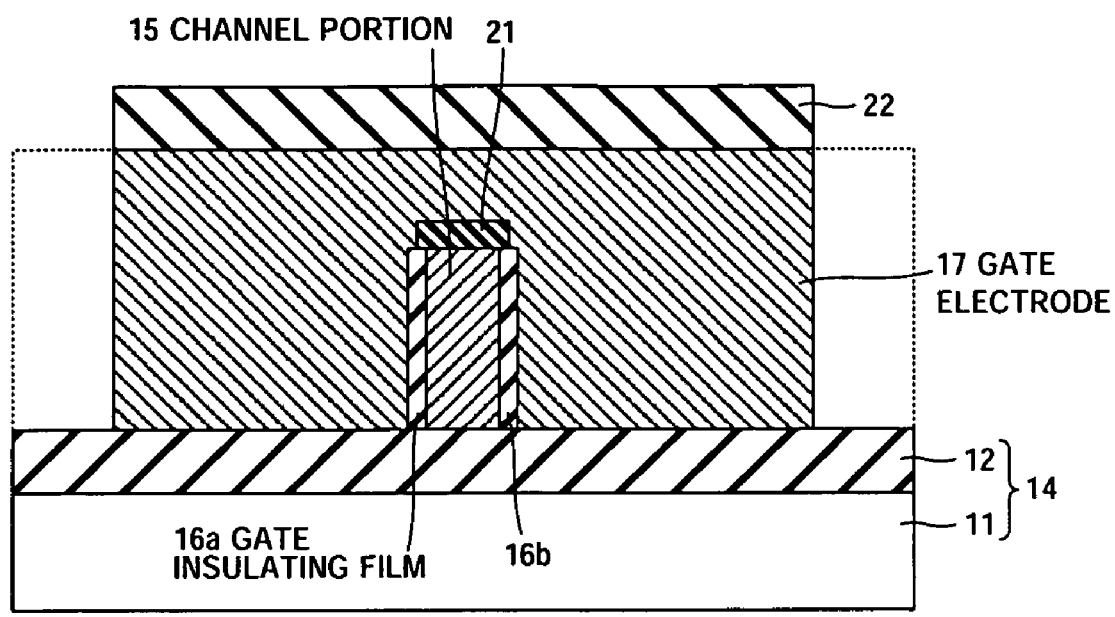

Next, as shown in FIG. 11, after the resist pattern 38 is removed, the polysilicon film 36 is selectively etched away using the insulating film 22 as a mask by, for example, utilizing the RIE method, thereby forming the gate electrode 17. Here, a region of the active region 34 having an upper surface, and both side faces which are surrounded with the gate electrode 17 is intended to become the channel portion 15, and a region other than the region intended to become the channel portion 15 is intended to become the first semiconductor layers 13a and 13b. In addition, portions of the silicon oxide film 35 which contact the gate electrode 17 are intended to become the gate insulating films 16a and 16b, respectively.

After that, although the silicon oxide film 35 formed on each of the side faces of the first semiconductor layers 13a and 13b, that is, the silicon oxide film 35 other than the portion which is intended to become each of the gate insulating films 16a and 16b is removed in the etching process, it may not be removed, but be left.

Figure 12:
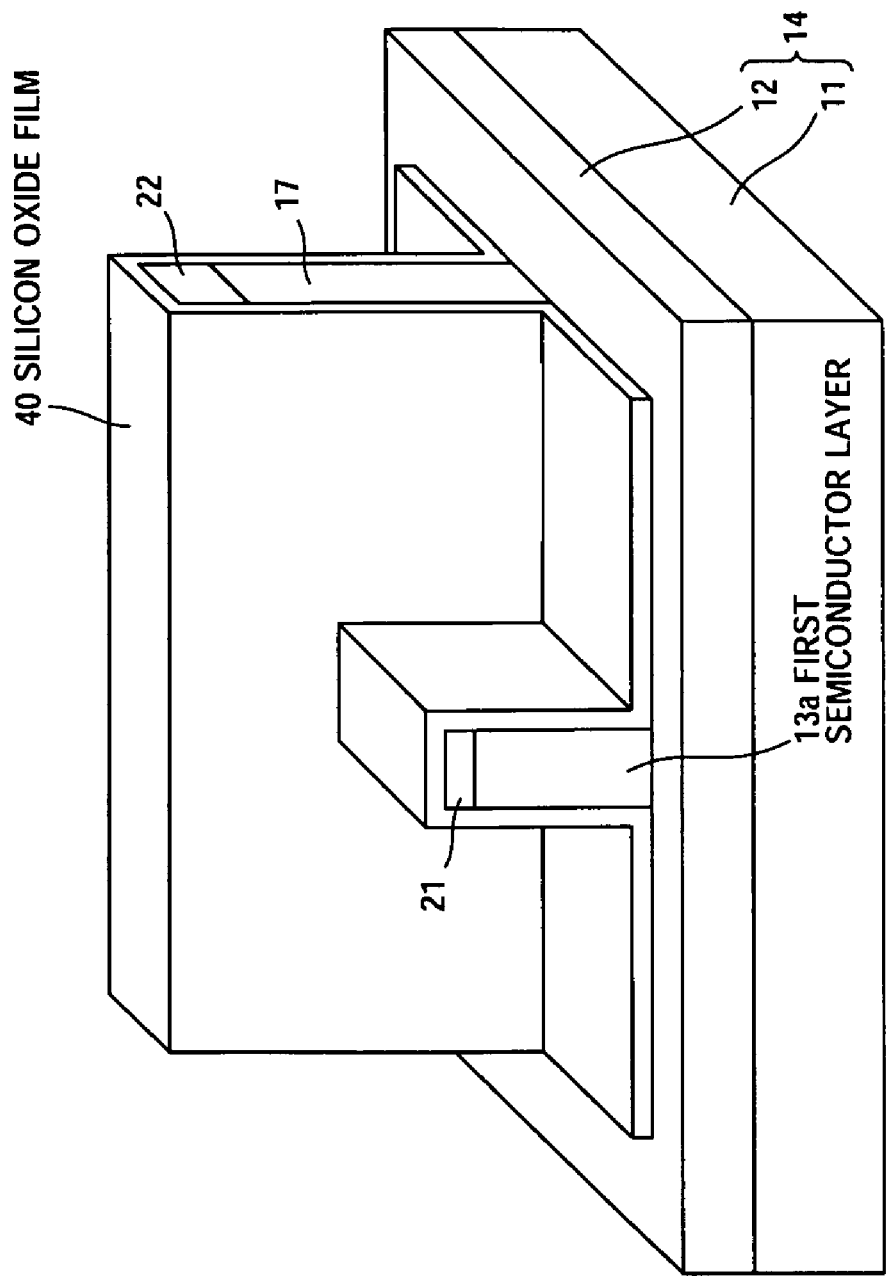
FIGS. 12 and 13 are respectively perspective views showing processes for fabricating the semiconductor device according to the first embodiment of the present invention in respective steps in the fabrication method.

Next, as shown in FIG. 12, a silicon oxide film 40 is formed over the substrate 14 including the gate electrode 17 and the active region 34.

Figure 13:
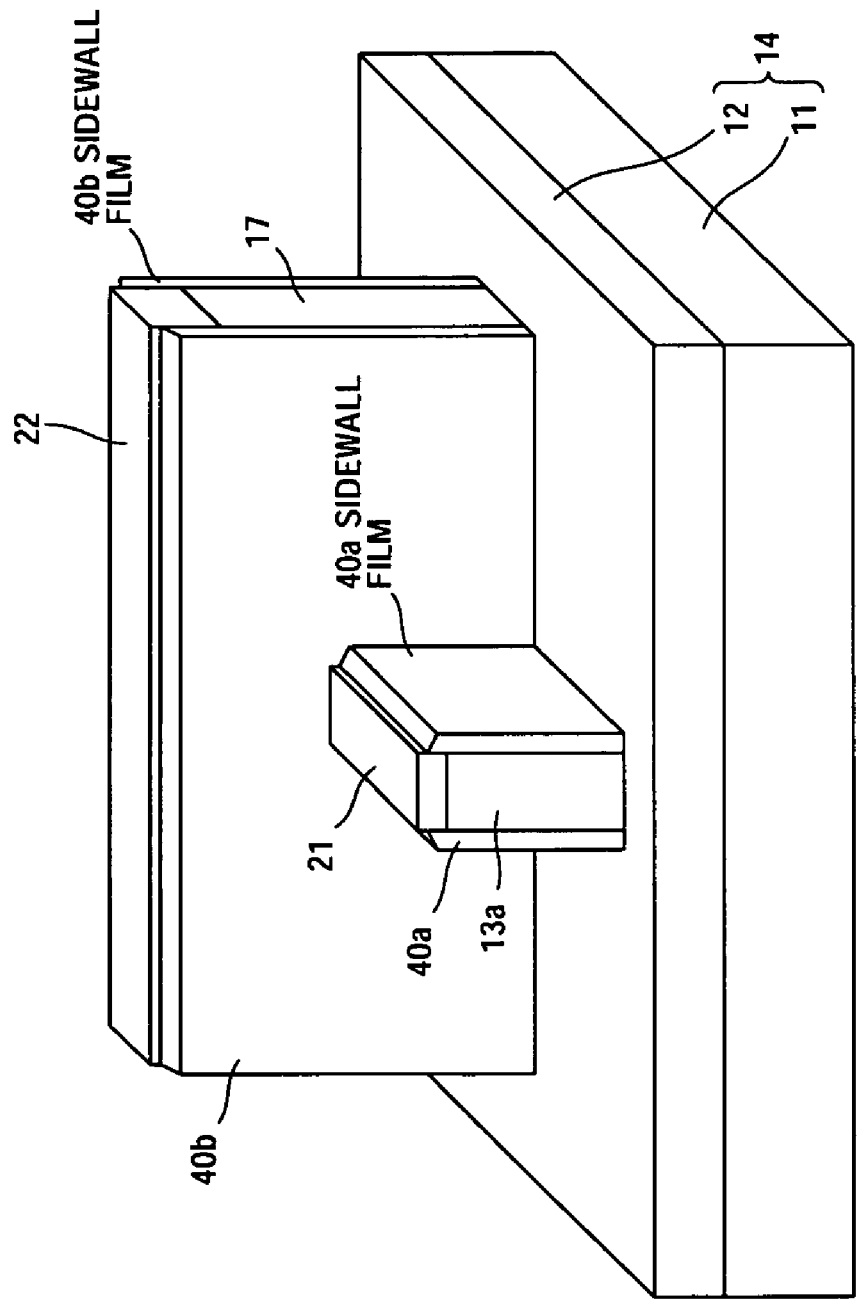

Next, as shown in FIG. 13, the silicon oxide film 40 is anisotropically etched by, for example, utilizing the RIE method, which results in that the sidewall films 40a are formed on side faces of the first semiconductor layers 13a and 13b, respectively, and sidewall films 40b are formed on side faces of the gate electrode 17, respectively.

Figure 14A:
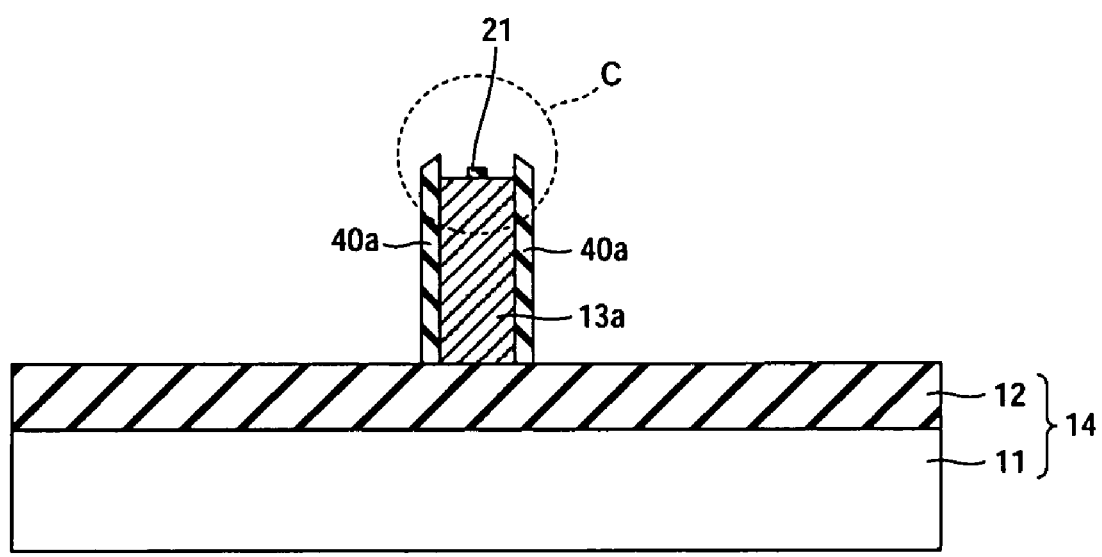
FIG. 14A is a cross sectional view showing a process for fabricating the semiconductor device according to the first embodiment of the present invention in a corresponding stage in the fabrication method.
Figure 14B:
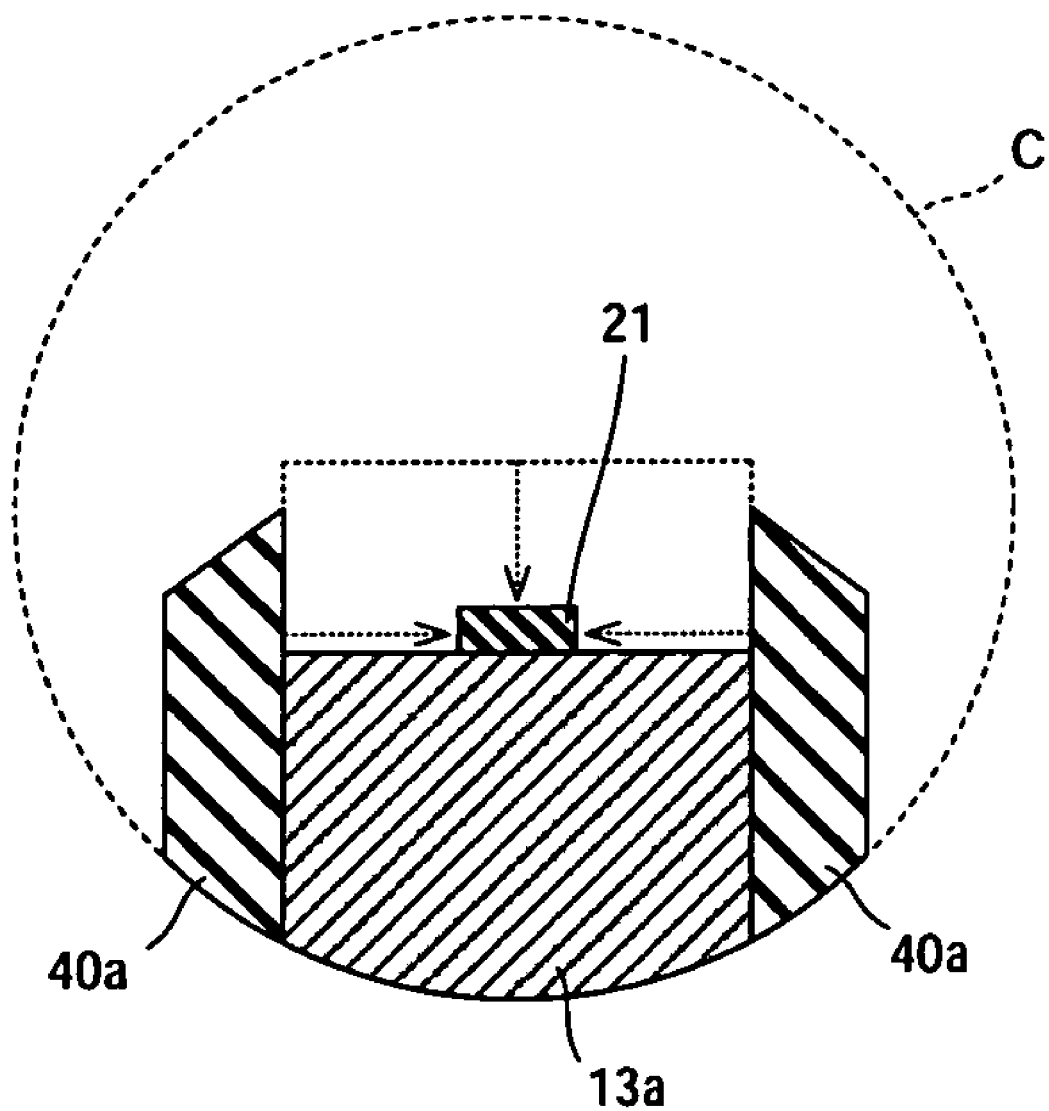
FIG. 14B is a partially enlarged view of a portion, of the semiconductor device, surrounded with a circle C shown in FIG. 14A.

Next, as shown in FIGS. 14A and 14B, the insulating film 21 is slimmed by, for example, utilizing a wet etching using a thermal phosphoric acid. Here, FIG. 14B is a partially enlarged view of a portion surrounded with a circle C in FIG. 14A.

Figure 15A:
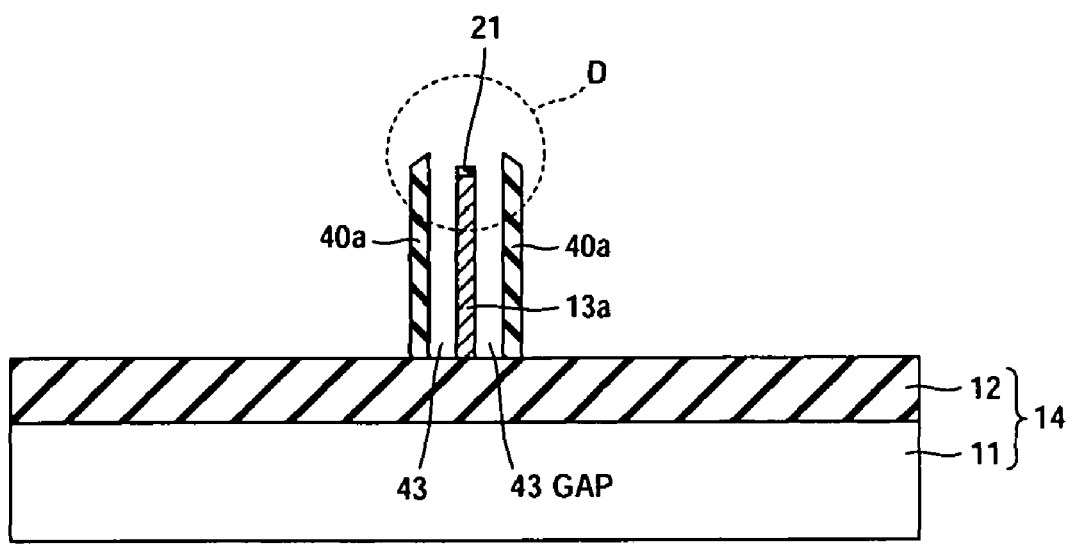
FIG. 15A is a cross sectional view showing a process for fabricating the semiconductor device according to the first embodiment of the present invention in a corresponding stage in the fabrication method.
Figure 15B:
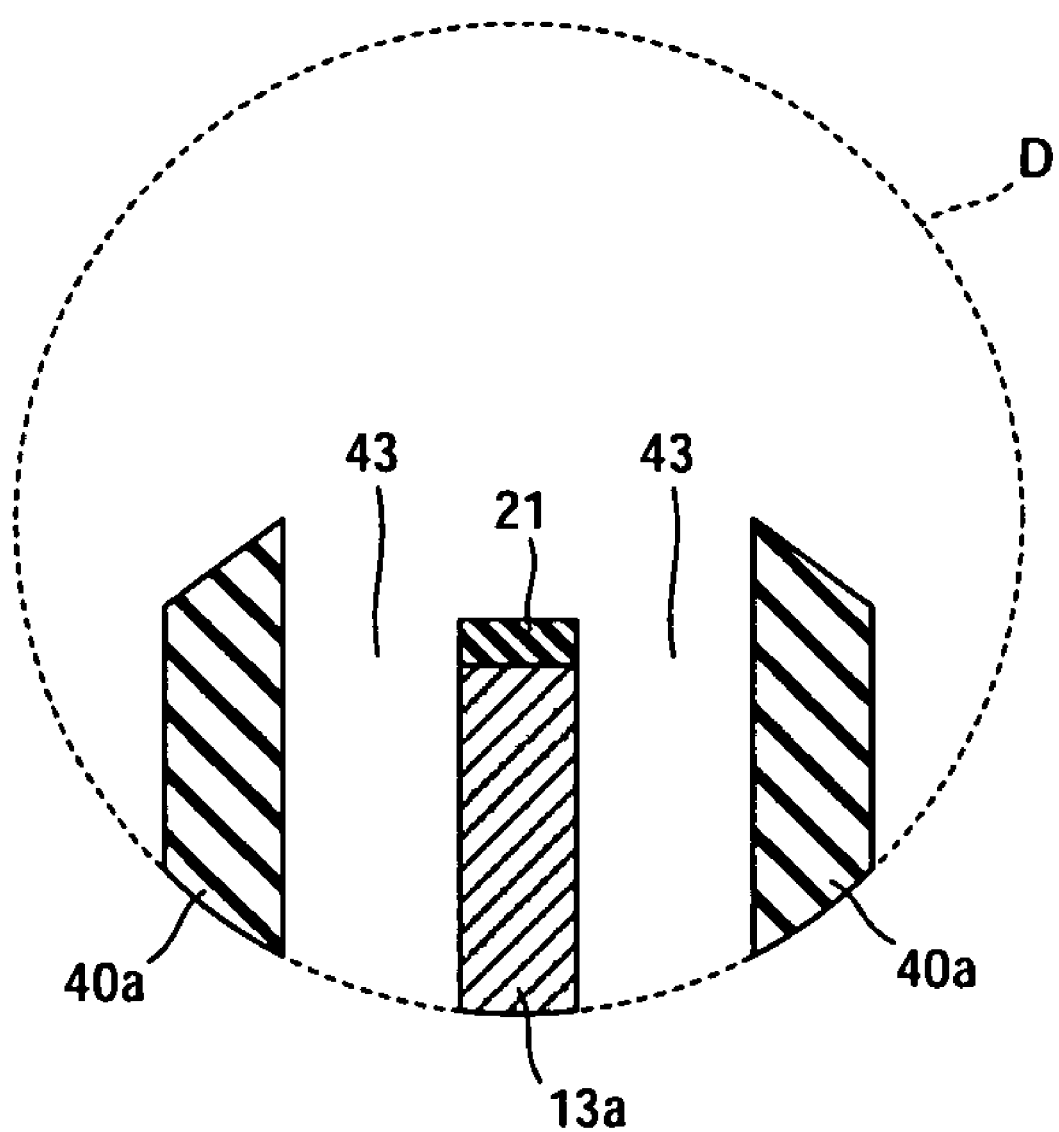
FIG. 15B is a partially enlarged view of a portion, of the semiconductor device, surrounded with a circle D shown in FIG. 15A.

Next, as shown in FIGS. 15A and 15B, unmasked regions of the first semiconductor layers 13a and 13b are selectively etched away until the surface of the insulating layer 12 of the substrate 14 is exposed using the slimmed insulating film 21 as a mask by, for example, utilizing the RIE method, thereby leaving a region underlying the slimmed insulating film 21. Here, FIG. 15B is a partially enlarged view of a portion surrounded with a circle D in FIG. 15A.

As a result, gaps 43 are defined between the sidewall films 40a, and the first semiconductor layers 13a and 13b thus left.

Figure 16A:
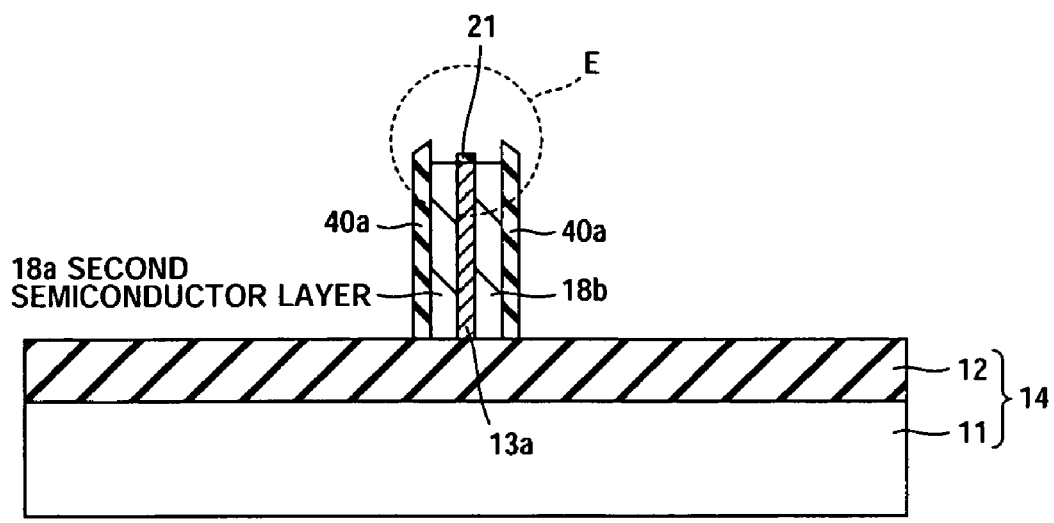
FIG. 16A is a cross sectional view showing a process for fabricating the semiconductor device according to the first embodiment of the present invention in a corresponding stage in the fabrication method.
Figure 16B:
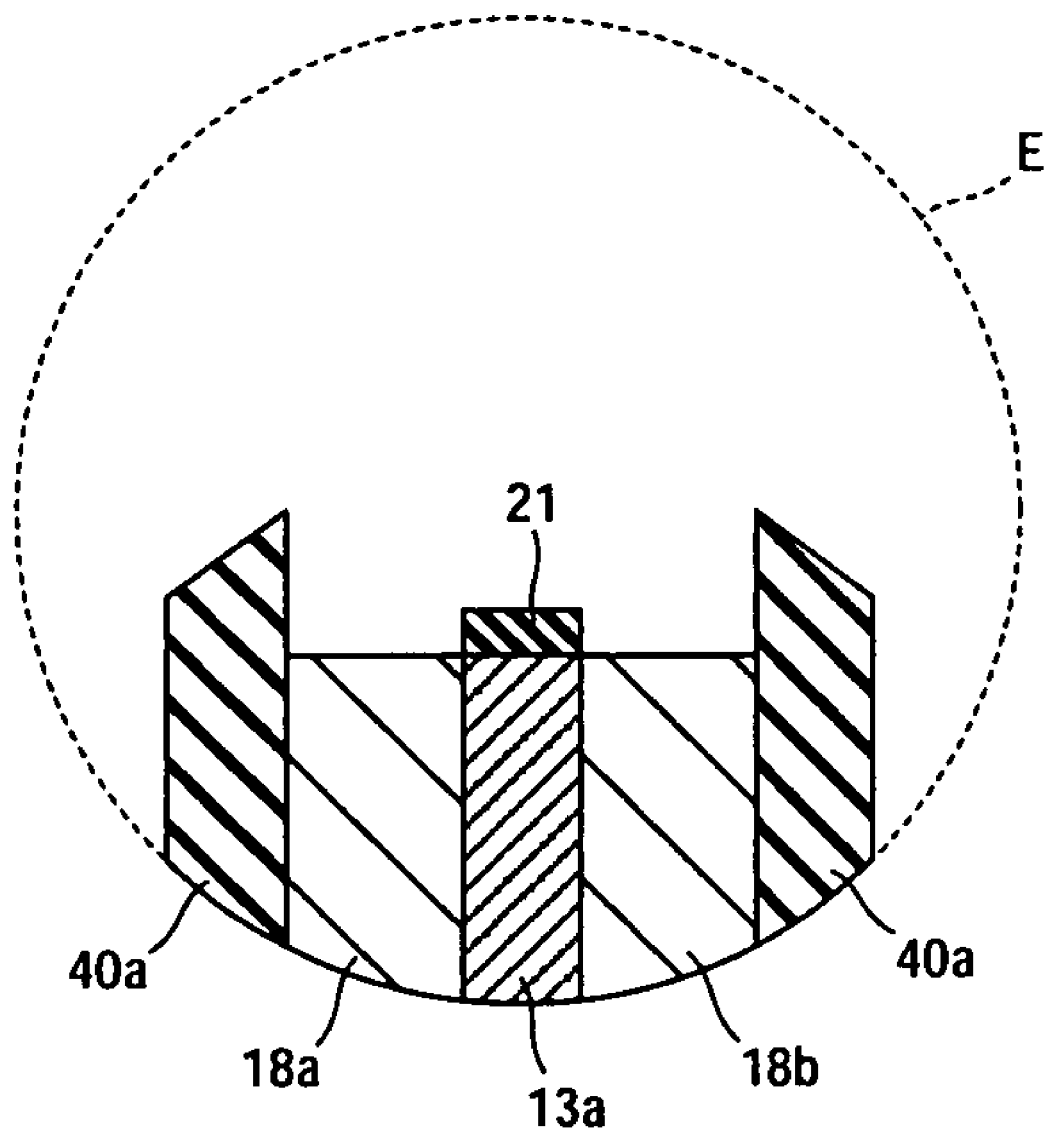
FIG. 16B is a partially enlarged view of a portion, of the semiconductor device, surrounded with a circle E shown in FIG. 16A.

Next, as shown in FIGS. 16A and 16B, a p-type SiGe crystal having a Ge concentration of about 10 to about 30 at % is epitaxially grown using each of the first semiconductor layers 13a and 13b as a growth substrate by utilizing a selective epitaxial growth method using a raw material gas of silane ($SiH_4$) and german ($GeH_4$) containing boron (B) added thereto, for example, a molecular beam epitaxy (MBE) method. As a result, each of gaps 43 is filled with the p-type SiGe crystal. Here, FIG. 16B is a partially enlarged view of a portion surrounded with a circle E in FIG. 16A.

As a result, the second semiconductor layers 18a and 18b are formed on the side faces of the first semiconductor layer 13a, respectively, and the second semiconductor layers 18c and 18d are formed on the side faces of the first semiconductor layer 13b, respectively.

As a result, the source region 19 having the second semiconductor layers 18a and 18b which are formed directly on the insulating layer 12 of the substrate 14 along the first and second side faces 131a and 132a of the first semiconductor layer 13a is formed on the third side face 15c of the channel portion 15 shown in FIG. 1.

Likewise, the drain region 20 having the second semiconductor layers 18c and 18d which are formed directly on the insulating layer 12 of the substrate 14 along the first and second side faces 131b and 132b of the first semiconductor layer 13b is formed on the fourth side face 15d of the channel portion 15 shown in FIG. 1.

Figure 17:
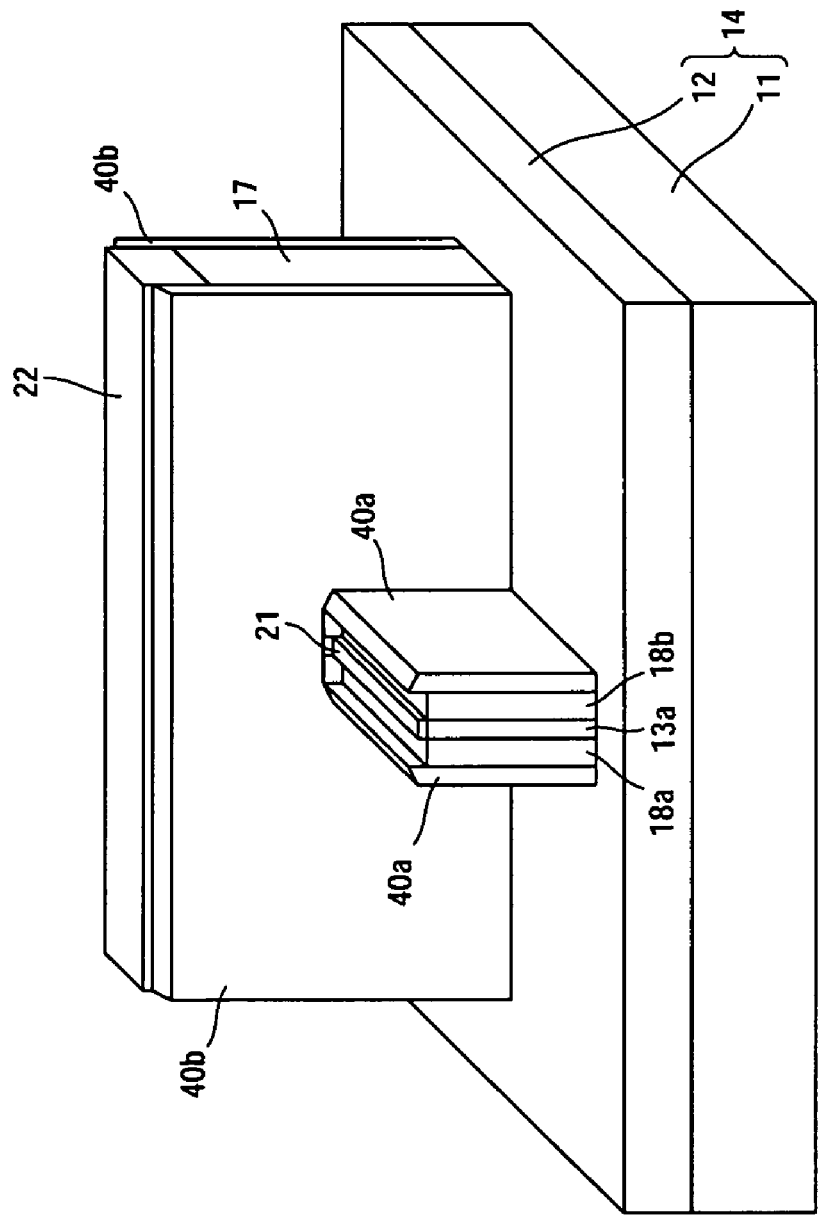
FIG. 17 is a perspective view showing a process for fabricating the semiconductor device according to the first embodiment of the present invention in a corresponding stage in the fabrication method.

FIG. 17 shows the state at this time. Note that, a figure in which illustration of the sidewall films 40a and 40b shown in FIG. 17 is omitted corresponds to FIG. 3A.

As has been described so far, in this embodiment, the first semiconductor layers 13a and 13b each being made of Si or the like is patterned so that each of central portions of the first semiconductor layers 13a and 13b is left, and the second semiconductor layers 18a, 18b, and 18c, 18d each being made of the SiGe crystal or the like are epitaxially grown by using each of the first semiconductor layers 13a and 13b thus left as the growth substrate.

As a result, the semiconductor layers 18a, 18b, and 18c, 18d which are approximately equal in thickness to one another and which are less in dispersion can be formed directly on the insulating layer 12 of the substrate 14.

Therefore, the compressive stress which each of the second semiconductor layers 18a, 18b, and 18c, 18d exerts, respectively, on the channel portion 15 is approximately constant, and thus the strain can be given to even the lower end portion of the channel portion 15.

Consequently, it is possible to obtain the semiconductor device 10 including the channel portion 15 having the sufficient carrier mobility.

Note that, although the case where the semiconductor device 10 is the p-channel FINFET has been described so far in this embodiment, the semiconductor device 10 may also be an n-channel FINFET.

In this case, a crystal having a lattice constant smaller than that of each of the first semiconductor layers is used as the material for each of the second semiconductor layers. For example, each of the first semiconductor layers is made of p-type silicon, and also n-type Si:C which contains therein carbon (C) of about 1 to about 3 at % and which is doped with arsenic (As), for example, can be used as the material for each of the second semiconductor layers.

Si:C, for example, can be formed by utilizing a chemical vapor deposition method using a mixed gas of silane ($SiH_4$) and methane ($CH_4$) as the raw material gas.

Si:C is strained because of its smaller lattice constant than that of silicon, and a compressive stress is generated in Si:C as the internal stress to exert a tensile stress on the channel portion 15. The channel portion 15 receives the tensile stress, thereby increasing the mobility of the carriers, that is, the electrons in this case.

In addition, although the case where each of the second semiconductor layers 18a, 18b, and 18c, 18d is epitaxially grown by utilizing the MBE method has been described so far, any other suitable selective growth method, for example, an ultra high vacuum chemical vapor deposition (UHVCVD) method may also be used.

Figure 19A:
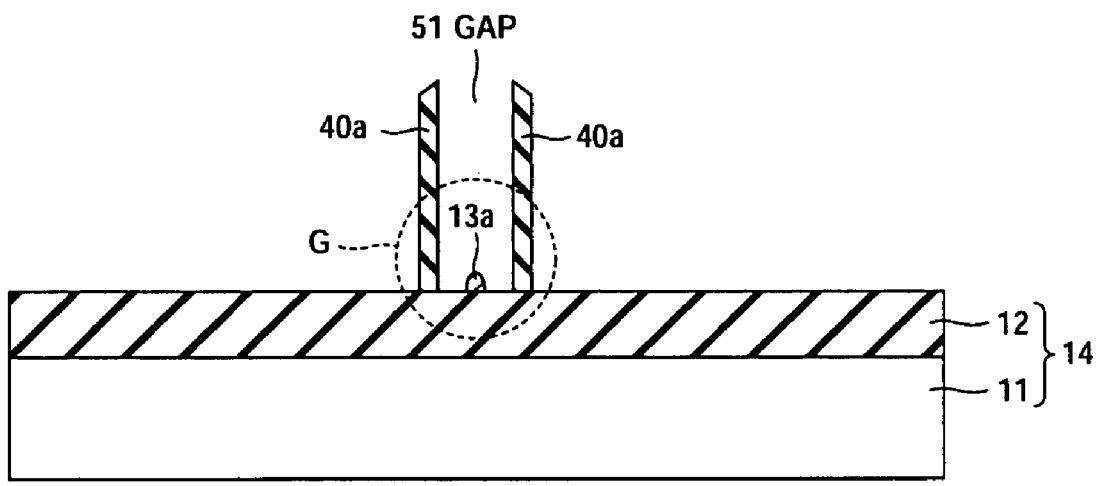
FIG. 19A is a cross sectional view showing a process for fabricating the semiconductor device according to the second embodiment of the present invention in a corresponding stage in the fabrication method.
Figure 19B:
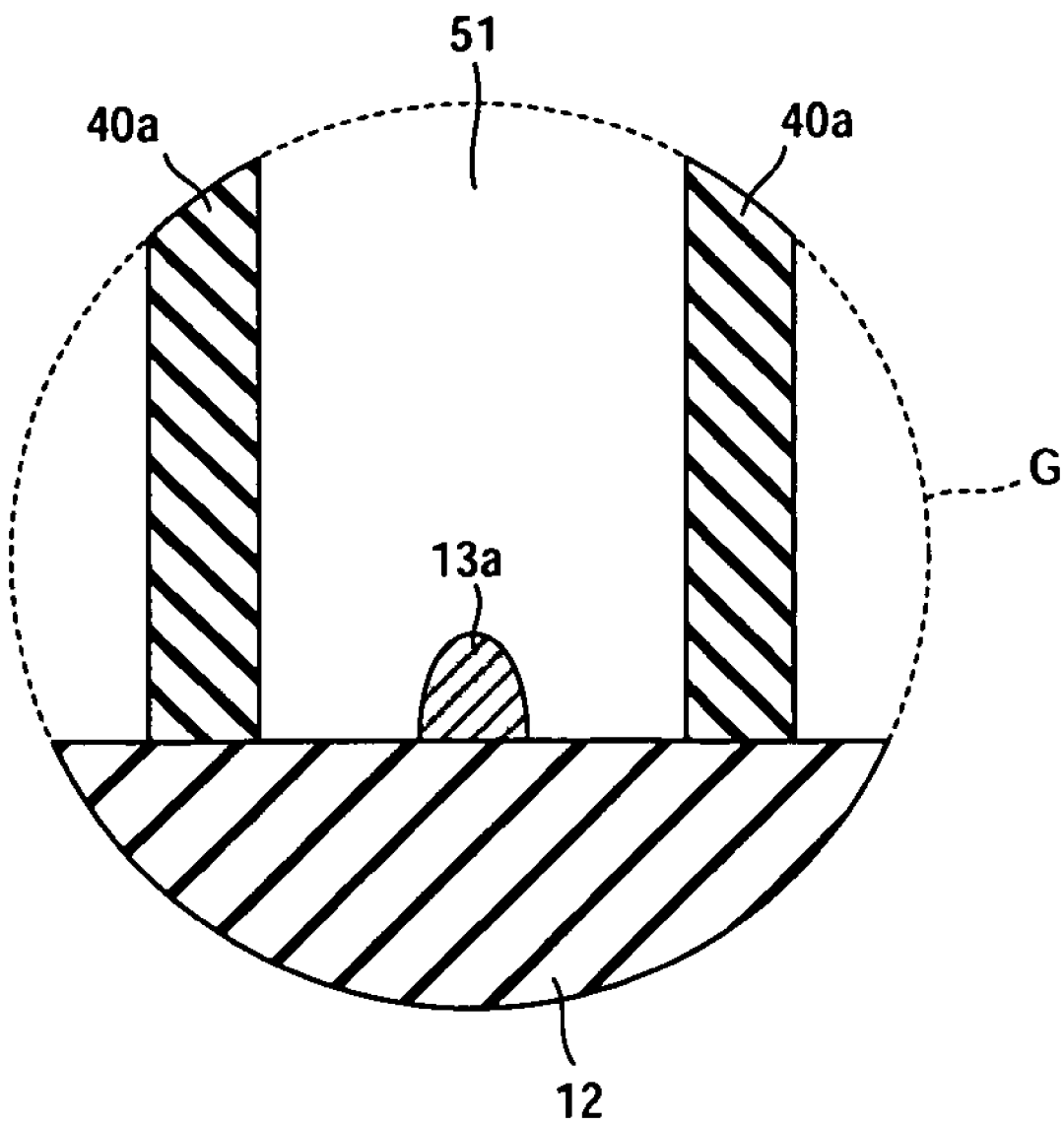
FIG. 19B is a partially enlarged view of a portion, of the semiconductor device, surrounded with a circle G shown in FIG. 19A.
Figure 20A:
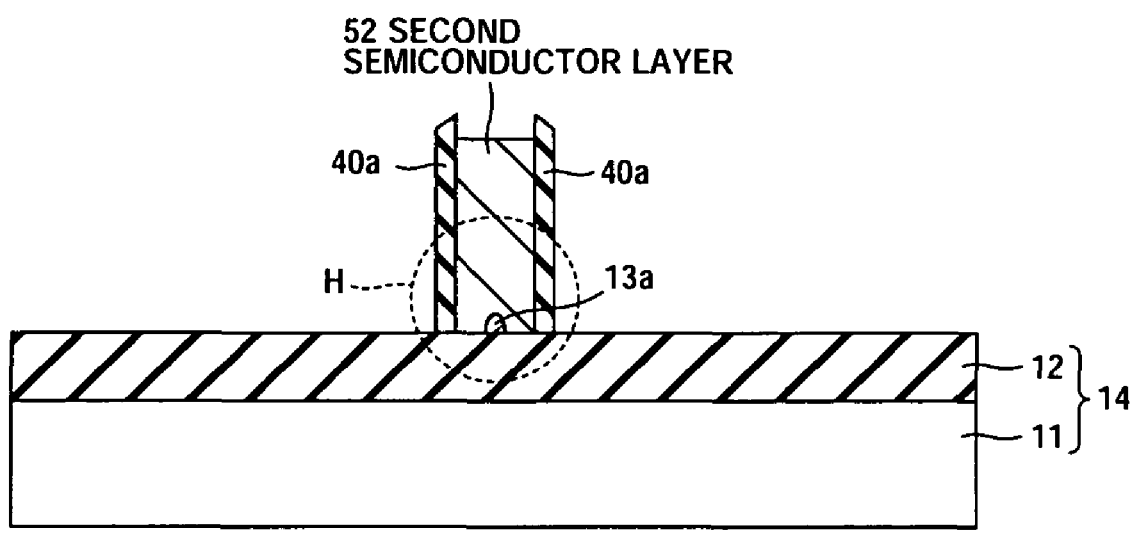
FIG. 20A is a cross sectional view showing a process for fabricating the semiconductor device according to the second embodiment of the present invention in a corresponding stage in the fabrication method.
Figure 20B:
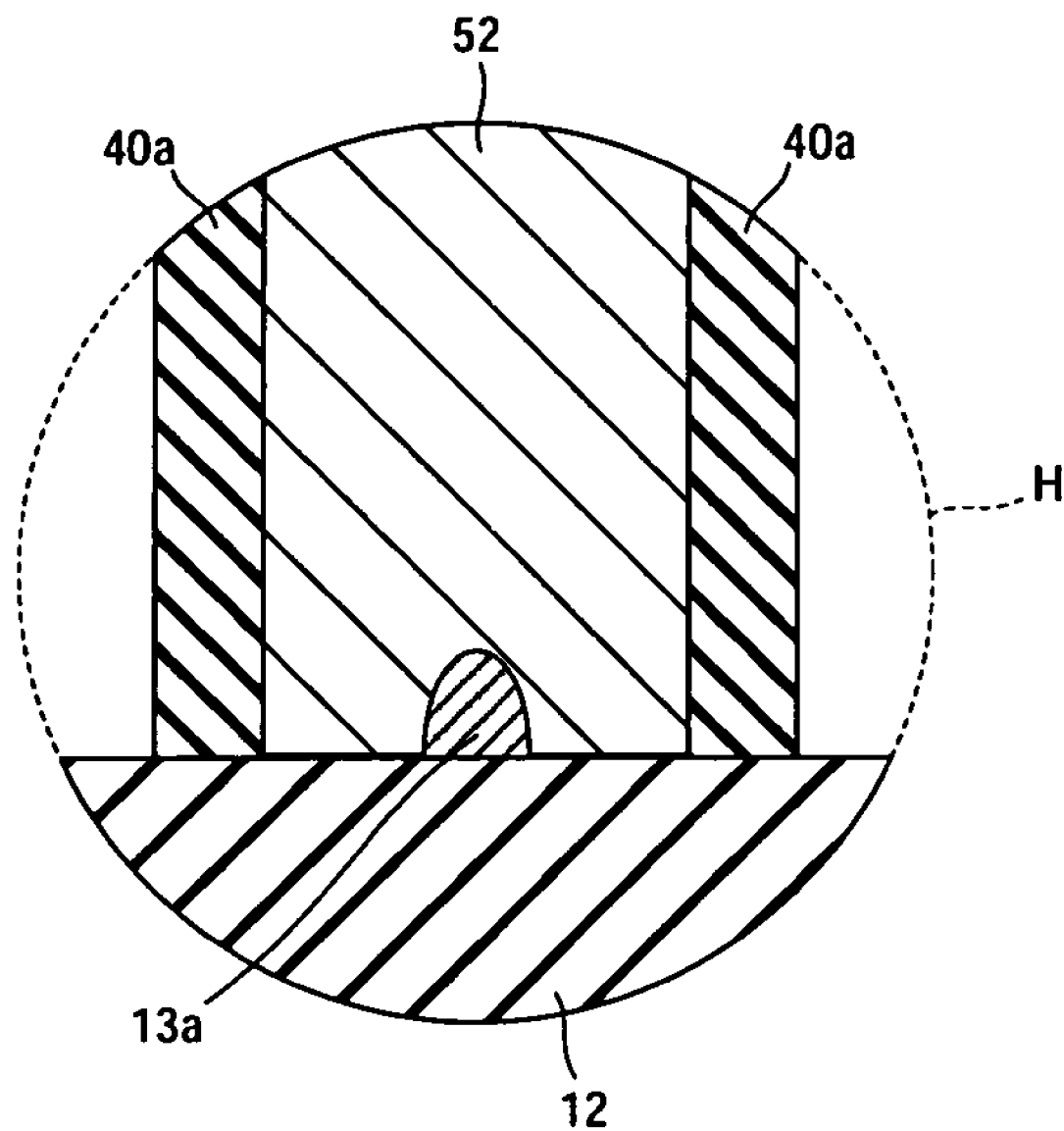
FIG. 20B is a partially enlarged view of a portion, of the semiconductor device, surrounded with a circle H shown in FIG. 20A.
Figure 21:
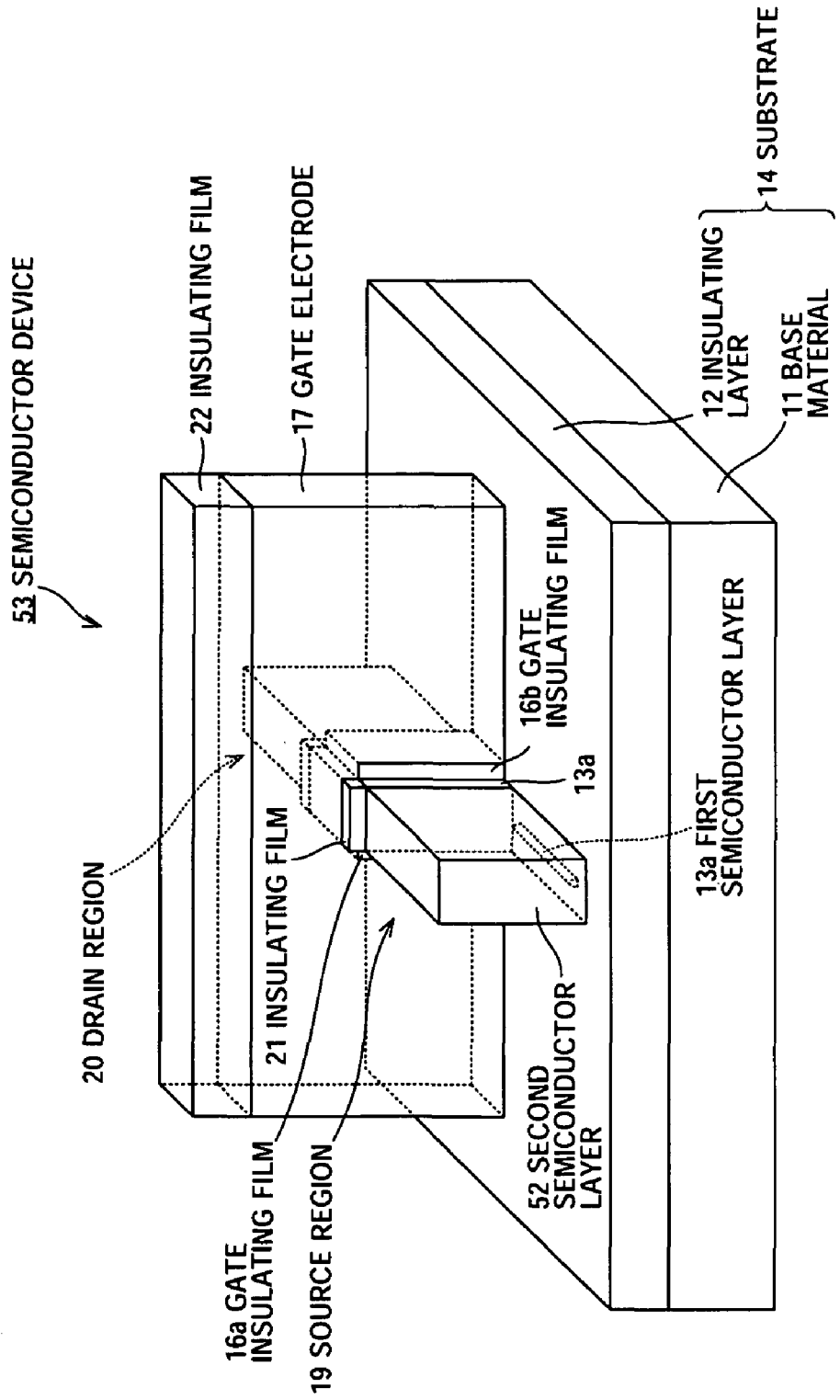
FIG. 21 is a perspective view showing a process for fabricating the semiconductor device according to the second embodiment of the present invention in a corresponding stage in the fabrication method.

FIGS. 18A and 18B to FIGS. 20A and 20B are respectively cross sectional views showing processes for fabricating a semiconductor device according to a second embodiment of the present invention in respective stages in a fabrication method, and FIG. 21 is a perspective view showing a process for fabricating the semiconductor device according to the second embodiment of the present invention in a corresponding stage in the fabrication method. In this embodiment, the same constituent elements as those in the first embodiment are designated with the same reference numerals, respectively, and a description thereof is omitted here for the sake of simplicity. Thus, only a different point is described now.

The semiconductor device of this embodiment is different from that of the first embodiment in shape of each of the first semiconductor layers 13a and 13b.

That is to say, in the method of fabricating the semiconductor device of this embodiment, firstly, the sidewall film 40a is formed on each of the side faces of the first semiconductor layers 13a and 13b in accordance with the processes shown in FIGS. 6 to 13, respectively.

Figure 18A:
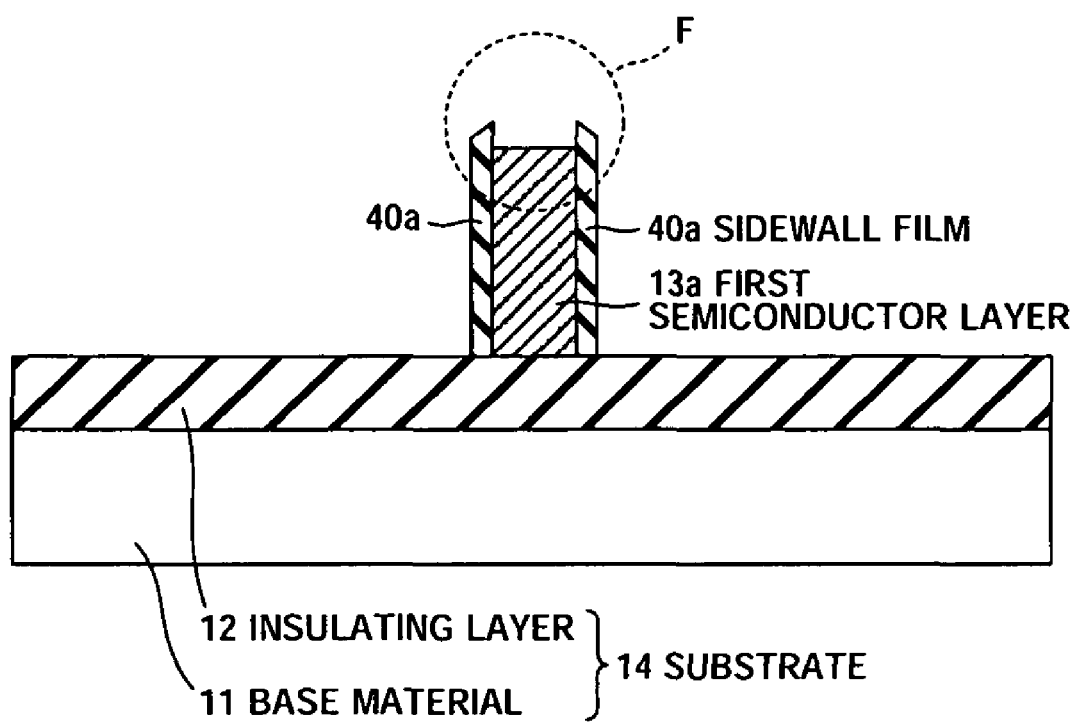
FIG. 18A is a cross sectional view showing a process for fabricating a semiconductor device according to a second embodiment of the present invention in a corresponding stage in a fabrication method.
Figure 18B:
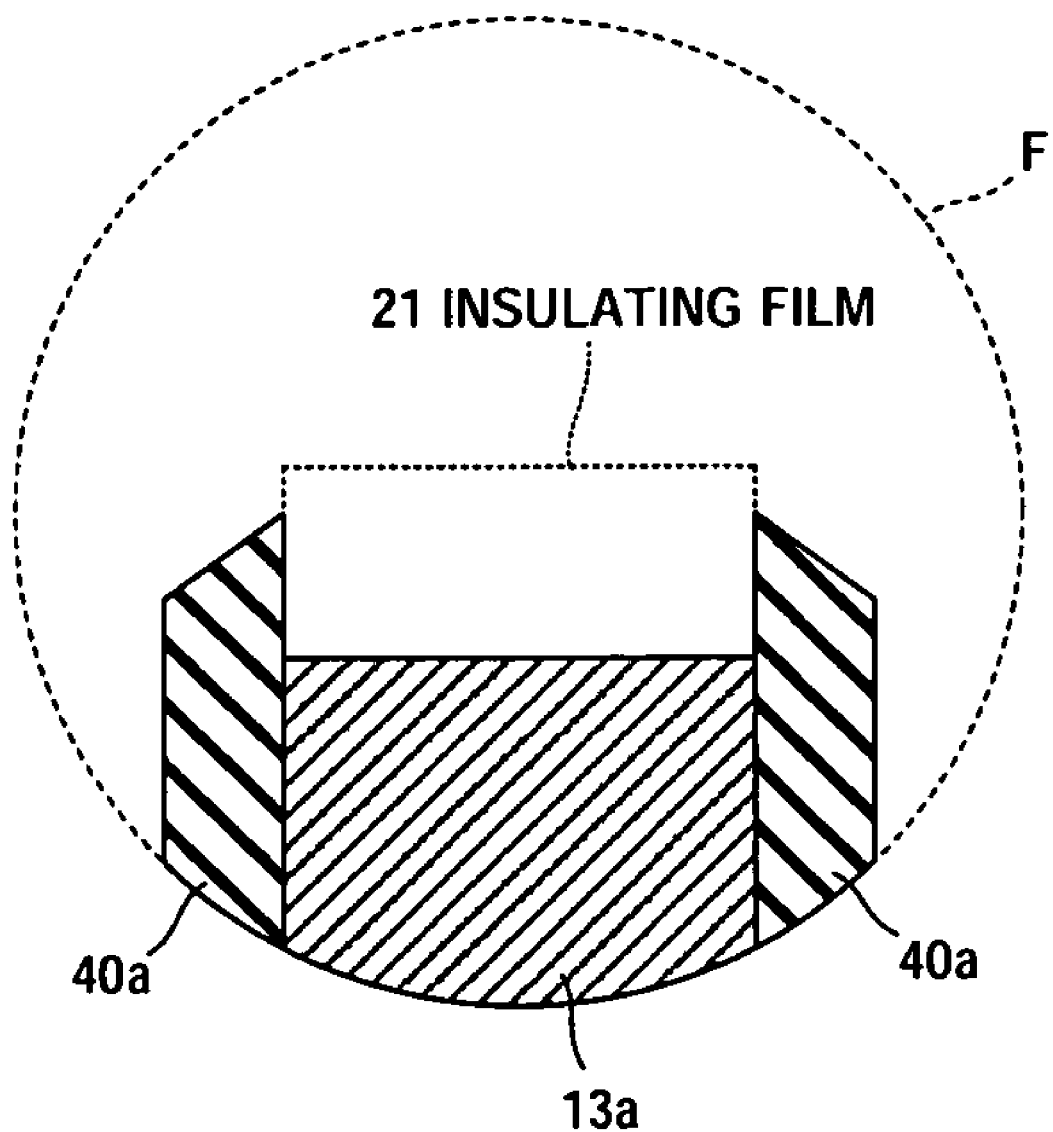
FIG. 18B is a partially enlarged view of a portion, of the semiconductor device, surrounded with a circle F shown in FIG. 18A.

Next, as shown in FIGS. 18A and 18B, the insulating film 21 formed on each of the first semiconductor layers 13a and 13b is removed by, for example, utilizing the wet etching using a thermal phosphoric acid, thereby exposing the upper surfaces of the first semiconductor layers 13a and 13b. Here, FIG. 18B is a partially enlarged view of a portion surrounded with a circle F in FIG. 18A.

Next, as shown in FIGS. 19A and 19B, the first semiconductor layers 13a and 13b are anisotropically etched under the condition that a gas pressure is set as about 40 mTorr or more, and a bias power is set as about 150 W or less by, for example, utilizing the RIE method using a mixed gas of a chlorine gas, an oxygen gas and a nitrogen gas ($Cl_2/O_2/N_2$). Here, FIG. 19B is a partially enlarged view of a portion surrounded with a circle G in FIG. 19A.

Since an etching rate of each of the first semiconductor layers 13a and 13b is high in the side of each of the sidewall films 40a and low in a central portion, the surface of the insulating film 12 on a side of each of the sidewall films 40a can be first exposed.

The etching utilizing the RIE method is completed at a time point when the surface of the insulating film 12 on the side of each of the sidewall films 40a is first exposed, which results in that central lower end portions of the first semiconductor layers 13a and 13b are not etched away, but left, and each of them has a rod-like shape extending in a direction along each of the sidewall films 40a on the insulating layer 12.

Next, as shown in FIGS. 20A and 20B, a second semiconductor layer 52 made of a p-type SiGe crystal containing boron (B) having a Ge concentration of about 10 to about 30 at % added thereto is epitaxially grown with each of the first semiconductor layers 13a and 13b thus left as a growth nucleus, thereby filling a gap 51 with the second semiconductor layer 52 from the insulating layer 12 of the substrate 14. Here, FIG. 20B is a partially enlarged view of a portion surrounded with a circle H in FIG. 20A.

As a result, as shown in FIG. 21, it is possible to obtain a semiconductor device 53 including the source region 19 and the drain region 20 which are formed on the third and fourth side faces 15c and 15d of the channel portion 15, respectively, and each of which has the second semiconductor layer 52 made of the p-type SiGe crystal. In this case, opposite portions of the second semiconductor layer 52 are formed directly on the insulating layer 12 of the substrate 14 so as to hold the gate electrode 17 between them. Note that, illustration of the sidewall films 40a and 40b is omitted in FIG. 21.

As has been described so far, in this embodiment, each of the first semiconductor layers 13a and 13b is formed in rod-like shape having a low height. As a result, this embodiment has such an advantage that since a large opening area is obtained in the gap 51, it is easy to fill the gap 51 with the second semiconductor layer 52 with each of the first semiconductor layers 13a and 13b as the growth nucleus.

Figure 22A:
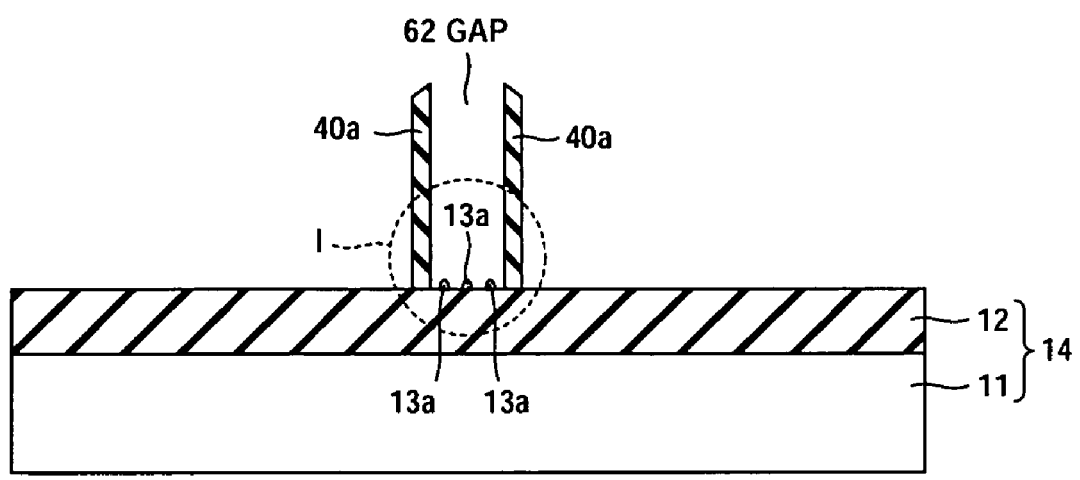
FIG. 22A is a cross sectional view showing a process for fabricating a semiconductor device according to a third embodiment of the present invention in a corresponding stage in a fabrication method.
Figure 22B:
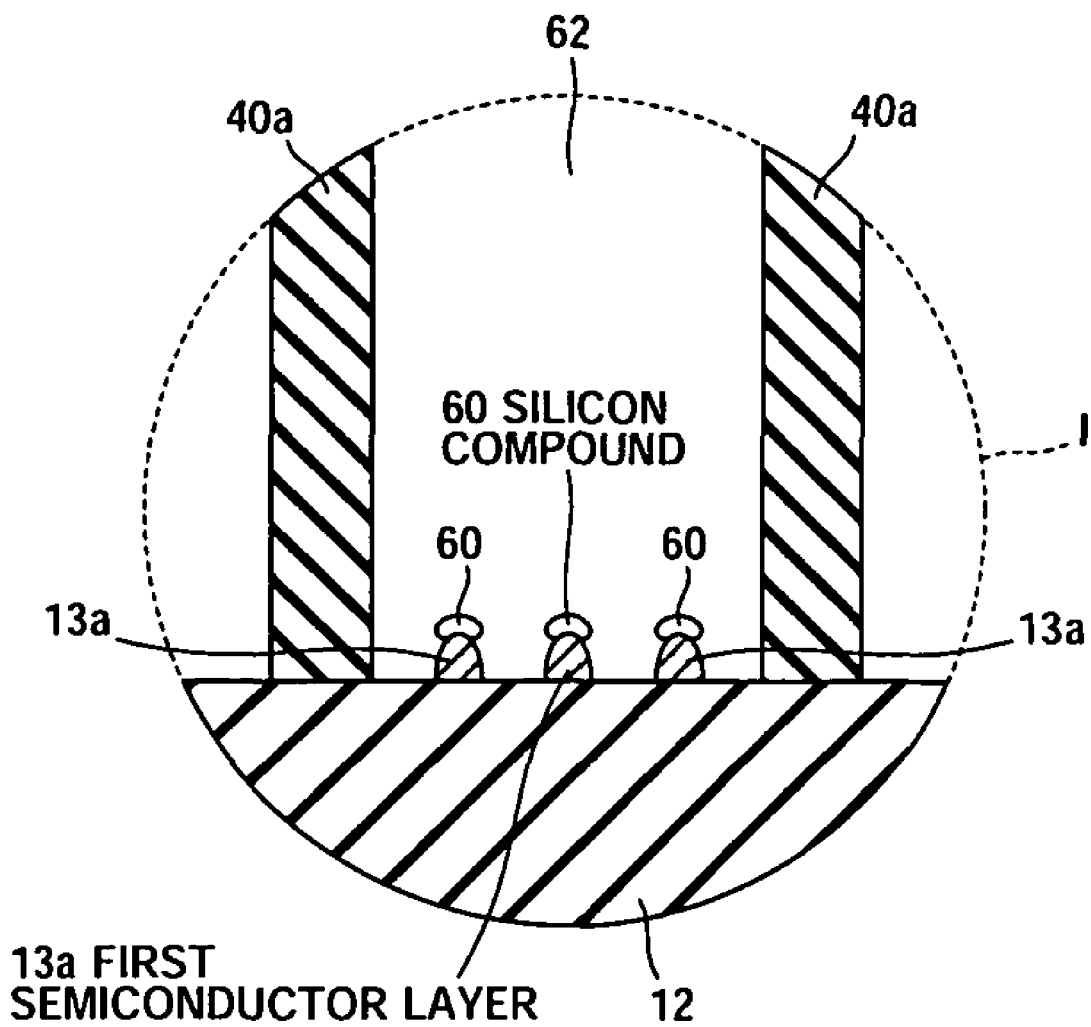
FIG. 22B is a partially enlarged view of a portion, of the semiconductor device, surrounded with a circle I shown in FIG. 22A.
Figure 23:
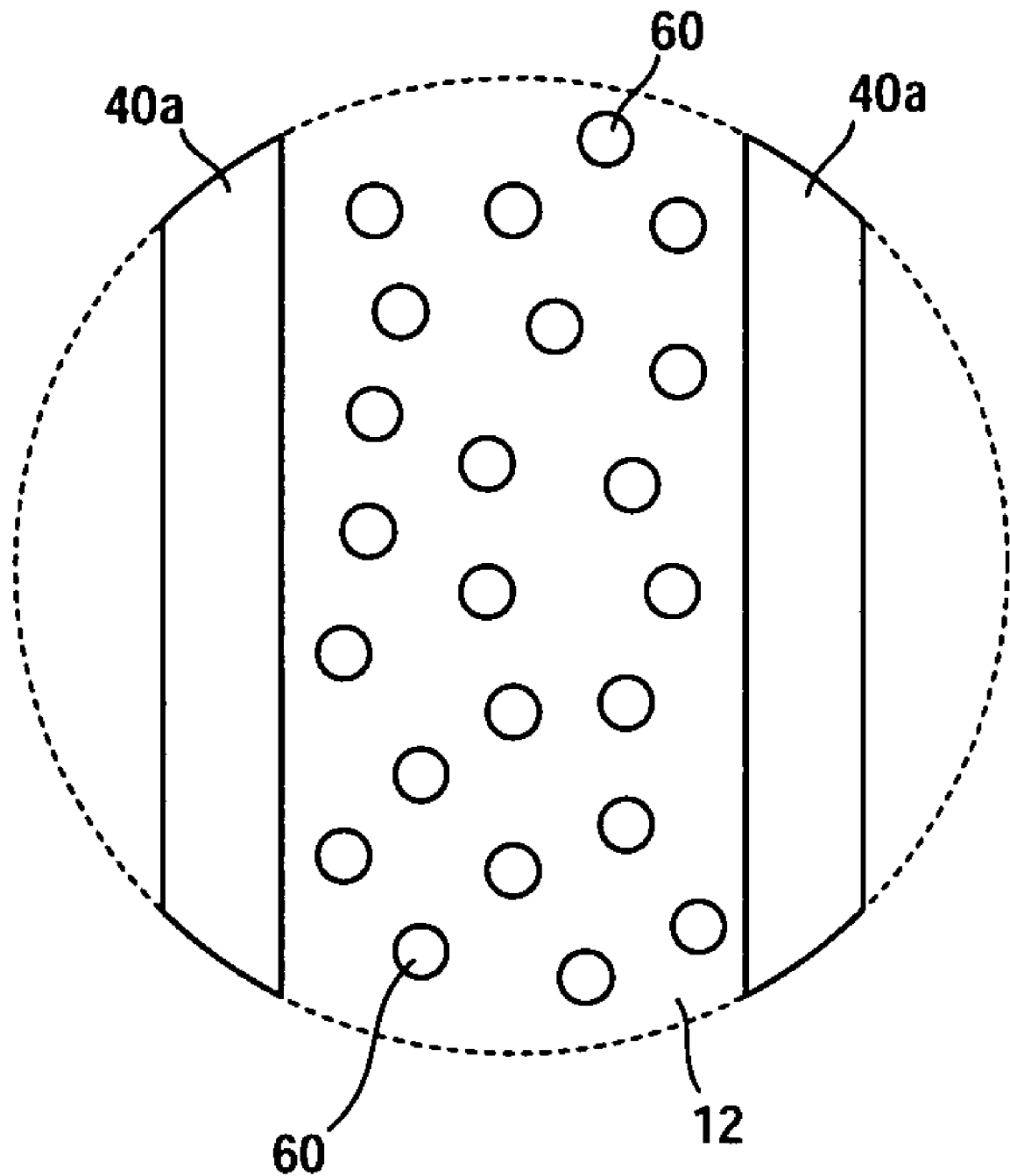
FIG. 23 is a plan view of a region of the part of the semiconductor device shown in FIG. 22B when viewed from an upper part.

FIGS. 22A and 22B, and FIGS. 24A and 24B are respectively cross sectional views showing processes for fabricating a semiconductor device according to a third embodiment of the present invention in respective stages in a fabrication method, and FIG. 23 is a plan view of a region of a part of the semiconductor device shown in FIG. 22B when viewed from an upper part. In this embodiment, the same constituent elements as those in the first embodiment are designated with the same reference numerals, respectively, and a description thereof is omitted here for the sake of simplicity. Thus, only a different point is described now.

The semiconductor device of this embodiment is different from that of the first embodiment in that a plurality of semiconductor layers 13a and 13b each having a protrusion shape are formed on the insulating film 12 so as to be separated apart from one another.

That is to say, according to a method of fabricating the semiconductor device of this embodiment, firstly, the sidewall film 40a is formed on each of the side faces of the first semiconductor layers 13a and 13b in accordance with the processes shown in FIGS. 6 to 13, respectively, and the insulating film 21 formed on each of the first semiconductor layers 13a and 13b is removed in accordance with the process shown in FIGS. 18A and 18B, thereby exposing the upper surfaces of the first semiconductor layers 13a and 13b.

Next, the upper end portions of the first semiconductor layers 13a and 13b are anisotropically etched (first anisotropic etching process) to a depth of about ⅔ or less of the full depth by, for example, utilizing the RIE method.

Next, as shown in FIGS. 22A and 22B, and FIG. 23, the first semiconductor layers 13a and 13b are anisotropically etched (second anisotropic etching process) until the surface of the insulating layer 12 is exposed under the condition that an oxygen ratio ($O_2/(HBr+O_2)$) is not lower than about 5 vol %, a gas pressure is not lower than 20 mTorr, and a bias power is not higher than about 100 W by, for example, utilizing the RIE method using a mixed gas ($HBr/O_2$) of a hydrogen bromide gas and an oxygen gas. Here, FIG. 22B is a partially enlarged view of a portion surrounded with a circle I in FIG. 22A, and FIG. 23 is a plan view of the region shown in FIG. 22B when viewed from an upper part.

The etching deposit is more in the condition for the second anisotropic etching process than in the condition for the first anisotropic etching process. Thus, a silicon compound (for example, $Si_xBr_xO_y$) which diffuses into the plasma in the etching process is re-dissociated to be discretely educed on the first semiconductor layers 13a and 13b which are being etched.

Since each of the silicon compounds 60 thus educed acts as an etching mask, the regions of the first semiconductor layers 13a and 13b underlying the silicon compounds 60 are not etched away, but left in island shape.

Figure 24A:
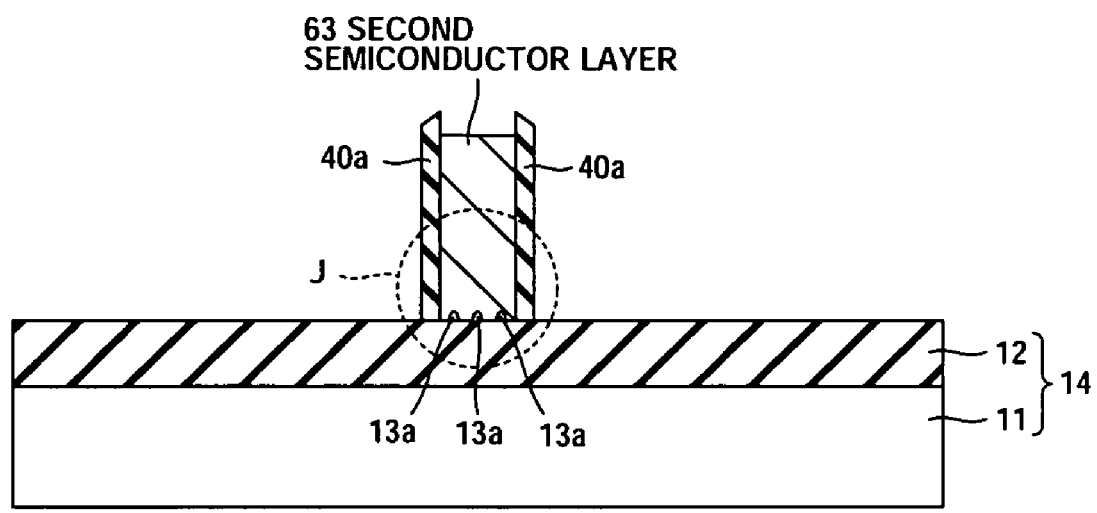
FIG. 24A is a cross sectional view showing a process for fabricating the semiconductor device according to the third embodiment of the present invention in a corresponding stage in the fabrication method.
Figure 24B:
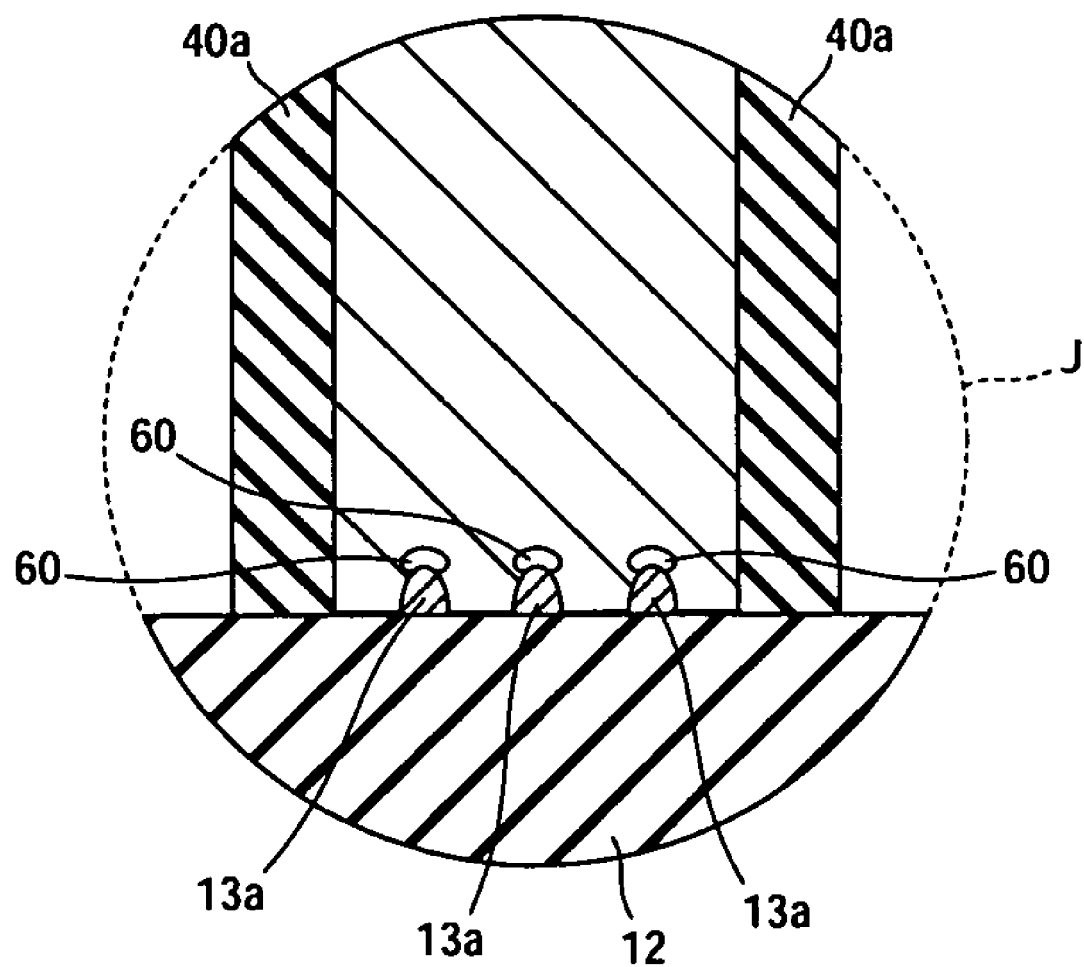
FIG. 24B is a partially enlarged view of a portion, of the semiconductor device, surrounded with a circle J shown in FIG. 24A.

Next, as shown in FIGS. 24A and 24B, a second semiconductor layer 63 made of a p-type SiGe crystal containing boron (B) added thereto and having a Ge concentration of about 10 to about 30 at % is epitaxially grown with each of the first semiconductor layers 13a and 13b left in island shape as a growth nucleus, thereby filling a gap 62 with the second semiconductor layer 63 from the insulating layer 12 of the substrate 14. Here, FIG. 248 is partially enlarged view of a portion surrounded with a circle J in FIG. 24A.

As has been described so far, in this embodiment, each of the first semiconductor layers 13a and 13b is formed in the form of a plurality of low protrusions which are disposed in island shape.

As a result, this embodiment has such an advantage that since a large opening area is obtained in the gap 62, it is easy to fill the gap 62 with the second semiconductor layer 63 with each of the first semiconductor layers 13a and 13b as the growth nucleus.

It should be noted that the present invention is not intended to be limited to the above-mentioned first to third embodiments, and the various kinds of changes thereof can be implemented by those skilled in the art without departing from the gist of the invention. For example, although the case where the semiconductor device is fabricated by using the SIMOX substrate as the substrate has been described so far in each of the above-mentioned first to third embodiments, the present invention is not limited thereto. That is to say, for example, a silicon on insulator (SOI) substrate may also be used which is obtained in such a way that two sheets of silicon substrates are stuck to each other through a silicon oxide film, and one silicon substrate is thinned in a polishing process.

Moreover, a so-called pn junction isolation substrate may also be used in which an isolation layer having a conductivity type opposite to that of a silicon substrate, and a well region having the same conductivity type as that of the silicon substrate are formed on the silicon substrate.

In the pn junction isolation substrate as well, the digging-down is performed from a surface of the well layer to the isolation layer, thereby enabling the FINFET to be formed similarly to the case of the SOI substrate or the like.

In addition, in the second and third embodiments, as described in the first embodiment, the semiconductor device can be fabricated in the form of the n-channel FINFET, or each of the second semiconductor layers may be grown by utilizing a suitable method other than the MBE method.

In addition, the constituent elements of the above-mentioned embodiments can be arbitrarily combined with each other without departing from the gist of the invention.

What is claimed is:

1. A method of fabricating a semiconductor device, comprising:
    processing a semiconductor layer laminated on a substrate, thereby forming a fin-shaped first semiconductor layer,
    forming a gate electrode on parts of both side faces of the first semiconductor layer through respective gate insulating films;
    forming sidewall films on regions, each having no gate electrode formed thereon, of the both side faces of the first semiconductor layer;
    removing the first semiconductor layer until a surface of the substrate is exposed while a part of the first semiconductor layer is left between the sidewall films; and
    growing a second semiconductor layer from a surface of the part of the first semiconductor layer thus left to fill a gap defined between the sidewall films with the second semiconductor layer, thereby forming a source region and a drain region each having a conductivity type different from that of the first semiconductor layer.

2. A method of fabricating a semiconductor device according to claim 1, wherein the first semiconductor layer is removed so that a portion of the first semiconductor layer located in a region in a vicinity of a center between the sidewall films is left in plate shape.

3. A method of fabricating a semiconductor device according to claim 2, wherein the first semiconductor layer is removed in an etching process using an etching mask.

4. A method of fabricating a semiconductor device according to claim 1, wherein the first semiconductor layer is removed so that a portion of the first semiconductor layer located in a region in a vicinity of the surface of the substrate in a region in a vicinity of a center between the sidewall films is left in rod shape.

5. A method of fabricating a semiconductor device according to claim 4, wherein the first semiconductor layer is removed in an anisotropic etching process.

6. A method of fabricating a semiconductor device according to claim 1, wherein the first semiconductor layer is removed so that a portion of the first semiconductor layer located in a region in a vicinity of the surface of the substrate is left in a form of a plurality of protrusions.

7. A method of fabricating a semiconductor device according to claim 6, wherein the first semiconductor layer is removed such that an upper portion of the first semiconductor layer is removed in a first anisotropic etching process, and a lower portion of the first semiconductor layer is removed in a second anisotropic etching process performed under a condition that an etching deposit is more in the second anisotropic etching process than in the first anisotropic etching process.

* * * * *